United States Patent
Endres

(10) Patent No.: US 12,298,361 B2
(45) Date of Patent: May 13, 2025

(54) MAGNETIC FIELD SENSOR SYSTEM WITH MAGNETIC VORTEX USED FOR B-FIELD REDIRECTION FOR OUT-OF-PLANE MAGNETIC FIELD

(71) Applicant: Infineon Technologies AG, Neubiberg (DE)

(72) Inventor: Bernhard Endres, Nabburg (DE)

(73) Assignee: Infineon Technologies AG, Neubiberg (DE)

( * ) Notice: Subject to any disclaimer, the term of this patent is extended or adjusted under 35 U.S.C. 154(b) by 161 days.

(21) Appl. No.: 18/335,408

(22) Filed: Jun. 15, 2023

(65) Prior Publication Data

US 2024/0418803 A1 Dec. 19, 2024

(51) Int. Cl.
*G01R 33/09* (2006.01)

(52) U.S. Cl.
CPC ......... *G01R 33/091* (2013.01); *G01R 33/098* (2013.01)

(58) Field of Classification Search
CPC .. G01R 33/091; G01R 33/098; G01R 33/093; G01R 33/0094; G01R 33/0206; G01R 33/025; G01R 33/0082; G01R 33/09; G01R 33/095; G01R 33/096; G01R 33/02; G01R 33/0017; G01R 33/0011; G01R 33/0005; G01R 33/00; G01R 33/0047

See application file for complete search history.

(56) References Cited

U.S. PATENT DOCUMENTS

| | | | | |
|---|---|---|---|---|
| 6,269,018 | B1* | 7/2001 | Monsma | G11C 13/0069 257/E27.005 |
| 2009/0117370 | A1* | 5/2009 | Deak | H10N 50/10 428/221 |
| 2013/0169371 | A1* | 7/2013 | Baraduc | H01F 10/3259 331/94.1 |
| 2014/0218122 | A1* | 8/2014 | Locatelli | H03B 15/006 331/94.1 |
| 2020/0105325 | A1* | 4/2020 | Tzoufras | G11C 11/1675 |
| 2022/0196764 | A1* | 6/2022 | Dounia | G01R 33/098 |

* cited by examiner

*Primary Examiner* — Alvaro E Fortich
(74) *Attorney, Agent, or Firm* — Harrity & Harrity, LLP

(57) ABSTRACT

A magnetic sensor system includes a magnetoresistive sensor comprising a magnetic free layer having a sensing plane and a magnetically-free magnetization arranged within the sensing plane, where the magnetically-free magnetization is variable in a presence of an in-plane magnetic field that is aligned with the sensing plane; and a ferromagnetic disc having a magnetic vortex in a ground state, wherein the magnetic vortex is configured to react to an out-of-plane magnetic field and generate a stray field in response to the out-of-plane magnetic field being applied to the ferromagnetic disc. The stray field has an in-plane magnetic field component that is proportional to the out-of-plane magnetic field. The magnetic free layer is configured to receive the in-plane magnetic field component of the stray field. The magnetically-free magnetization is configured to change based on the in-plane magnetic field component of the stray field.

21 Claims, 5 Drawing Sheets

MAGNETIC FIELD SENSOR SYSTEM WITH MAGNETIC VORTEX USED FOR B-FIELD REDIRECTION FOR OUT-OF-PLANE MAGNETIC FIELD

BACKGROUND

Magnetic field sensors based on a magnetoresistance effect are referred to as magnetoresistive sensors and are often used in magnetic field sensing applications, such as current sensing, position sensing, and angle sensing. Magnetoresistance is a property of a material to change a value of the material's electrical resistance when an external magnetic field is applied to the material. On account of magnetoresistive sensors' high signal level and high accuracy, and the possibility to integrate magnetoresistive sensors into complementary metal-oxide-semiconductor (CMOS) and bipolar-CMOS (BiCMOS) technologies, magnetoresistive sensors may be a preferred choice over Hall-based sensors. Some types of magnetoresistive sensors include anisotropic magnetoresistance (AMR) sensors, giant magnetoresistance (GMR) sensors, and tunnel magnetoresistance (TMR) sensors, each of which utilizes a corresponding magnetoresistive effect.

There are many applications in which measuring an electric current is desired. As one example, it may be desired to measure one or more electric currents of a battery system of an electric vehicle. In another example, it may be desired to measure one or more electric currents provided to a load, such as an electric motor. In yet further examples, it may be desired to measure one or more electric currents of a power distribution system or one or more electric currents in a circuit.

Because an electric current flowing through a current-carrying conductor produces a magnetic field with a magnetic field flux density that is proportional to a magnitude of the electric current, magnetic field sensors can be used as current sensors. By placing a magnetic field sensor near the current-carrying conductor, the magnetic field sensor can generate a measurable quantity, such as a voltage, that is proportional to the magnetic field sensed by the magnetic field sensor. However, the magnetic field flux density in a space around the current-carrying conductor decreases with increasing distance from the current-carrying conductor. Therefore, a sensor element of the magnetic field sensor may be placed in close proximity to the current-carrying conductor.

In addition, a magnetic field sensor may be used to sense a position of an object. As one example, a magnet may be coupled to an object of interest (e.g., a target object). As a result, if the magnetic field sensor is placed in a fixed position, a magnetic field produced by the magnet and sensed at the magnetic field sensor changes as a position of the object changes. For example, a magnetic field flux density of the magnetic field incident on the magnetic field sensor may increase as the object, along with the magnet, moves closer to the magnetic field sensor, and may decrease as the object, along with the magnet, moves farther from the magnetic field sensor. Thus, by placing the magnetic field sensor near a trajectory of the magnet, the magnetic field sensor can generate a measurable quantity, such as a voltage, that is proportional to the position of the object in connection with the magnetic field produced by the magnet.

SUMMARY

In some implementations, a magnetic sensor system includes a magnetoresistive sensor comprising a magnetic free layer having a sensing plane and a magnetically-free magnetization arranged within the sensing plane, wherein the magnetically-free magnetization is variable in a presence of an in-plane magnetic field that is aligned with the sensing plane; and a ferromagnetic disc having a magnetic vortex in a ground state, wherein the magnetic vortex is configured to react to an out-of-plane magnetic field and generate a stray field in response to the out-of-plane magnetic field being applied to the ferromagnetic disc, wherein the stray field has an in-plane magnetic field component that is proportional to the out-of-plane magnetic field, wherein the magnetic free layer is configured to receive the in-plane magnetic field component of the stray field, and wherein the magnetically-free magnetization is configured to change based on the in-plane magnetic field component of the stray field.

In some implementations, a magnetic sensor system includes a first magnetoresistive sensor having a first sensitivity axis and a first magnetic free layer having a first magnetically-free magnetization that is variable in a presence of an in-plane magnetic field that is aligned with the first sensitivity axis; a second magnetoresistive sensor having a second sensitivity axis and a second magnetic free layer having a second magnetically-free magnetization that is variable in a presence of the in-plane magnetic field that is aligned with the second sensitivity axis; and a ferromagnetic disc having a magnetic vortex in a ground state, wherein the magnetic vortex is configured to react to an out-of-plane magnetic field and generate a stray field in response to the out-of-plane magnetic field being applied to the ferromagnetic disc, wherein the stray field decays with an increasing distance from the ferromagnetic disc, wherein the first magnetoresistive sensor is arranged within the stray field and the second magnetoresistive sensor is arranged outside of the stray field, wherein the stray field has an in-plane magnetic field component that is proportional to the out-of-plane magnetic field, wherein the first magnetic free layer is configured to receive the in-plane magnetic field component of the stray field, and wherein the first magnetically-free magnetization is configured to change based on the in-plane magnetic field component of the stray field.

In some implementations, a magnetic sensor system includes a ferromagnetic disc having a magnetic vortex in a ground state, wherein the magnetic vortex is configured to react to an out-of-plane magnetic field and generate a stray field in response to the out-of-plane magnetic field being applied to the ferromagnetic disc, wherein the stray field has a first in-plane magnetic field component and a second in-plane magnetic field component that are proportional to the out-of-plane magnetic field, and wherein the first in-plane magnetic field component has a first vector in a first direction and the second in-plane magnetic field component has a second vector in a second direction that is antiparallel to the first direction; a first magnetoresistive sensor comprising a first sensitivity axis and a first magnetic free layer having a first magnetically-free magnetization that is variable in a presence of an external in-plane magnetic field that is aligned with the first sensitivity axis; and a second magnetoresistive sensor having a second sensitivity axis and a second magnetic free layer having a second magnetically-free magnetization that is variable in a presence of the external in-plane magnetic field that is aligned with the second sensitivity axis, wherein the first sensitivity axis is parallel to the second sensitivity axis, wherein the first magnetoresistive sensor is arranged within the first in-plane magnetic field component of the stray field to detect the first vector, and wherein the second magnetoresistive sensor is arranged within the second in-plane magnetic field component of the stray field to detect the second vector.

Implementations are described herein with reference to the appended drawings.

Figure 2:
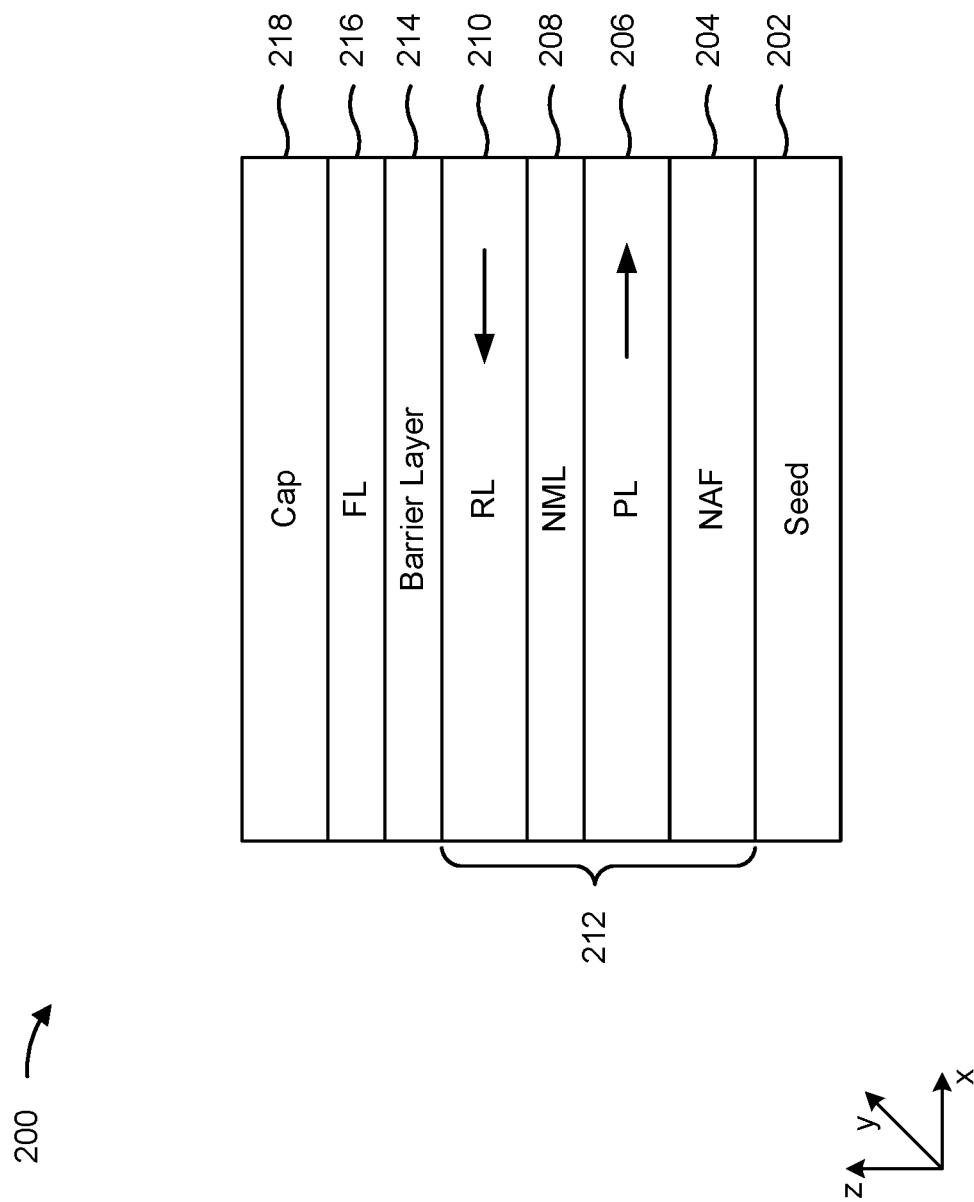

FIG. 2 shows an example of a layer stack of a magnetoresistive sensing element according to one or more implementations.

Figure 3:
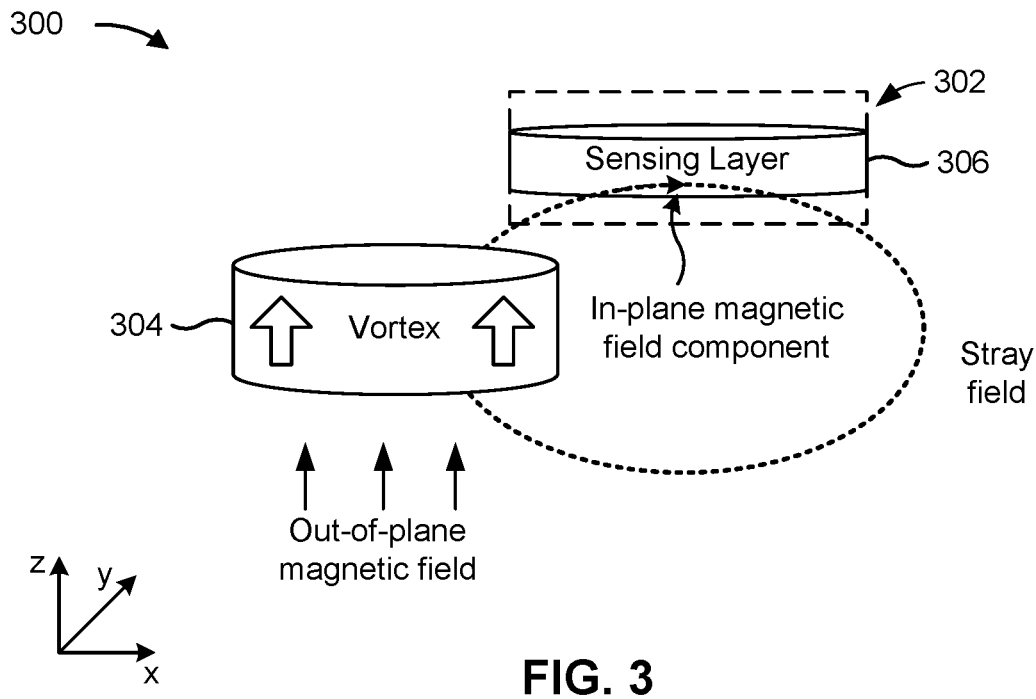

FIG. 3 shows an example of a magnetic sensor system according to one or more implementations.

Figure 4A:
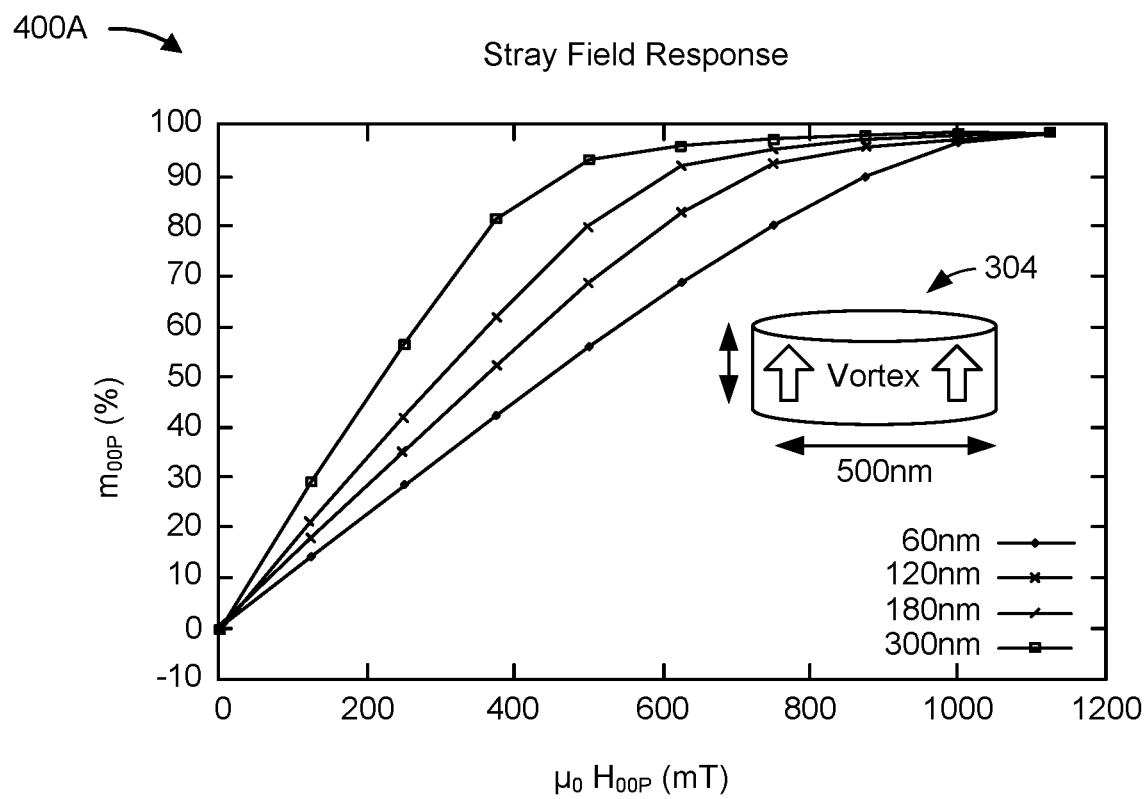

FIG. 4A shows an example of a diagram of a magnetization of a ferromagnetic disc according to one or more implementations.

Figure 4B:
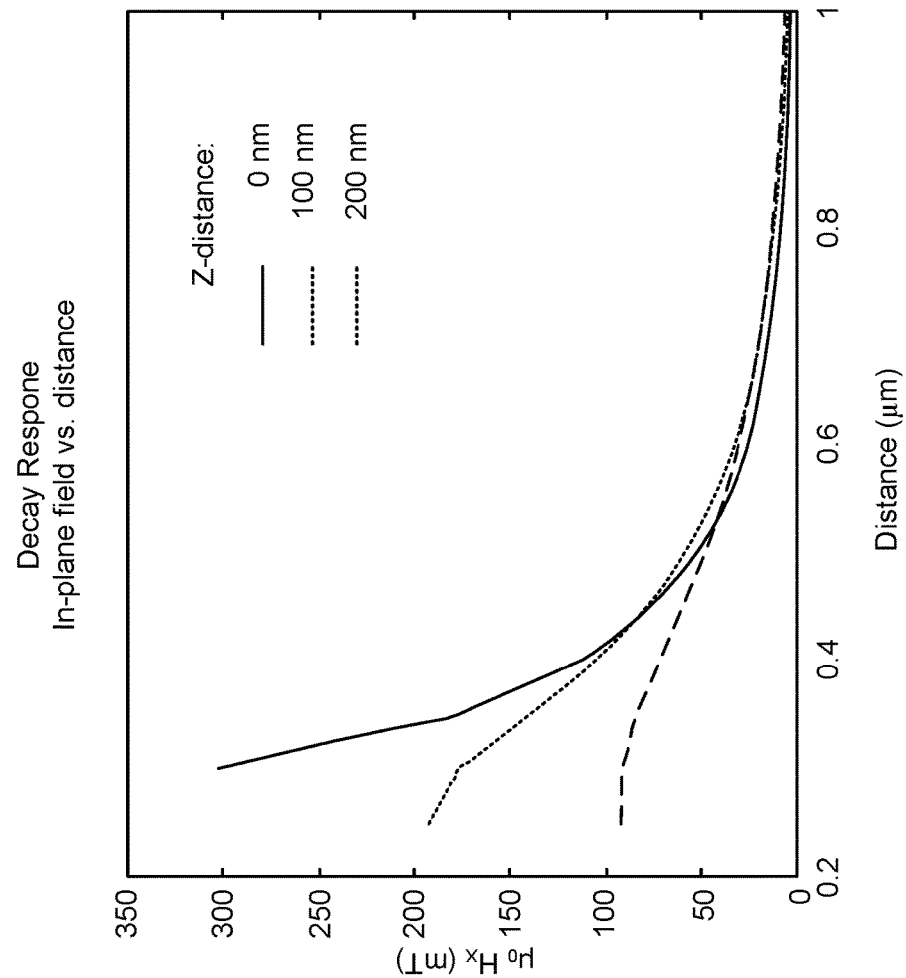

FIG. 4B shows an example of a diagram of a decay response of an in-plane magnetic field component of a stray field according to one or more implementations.

Figure 5:
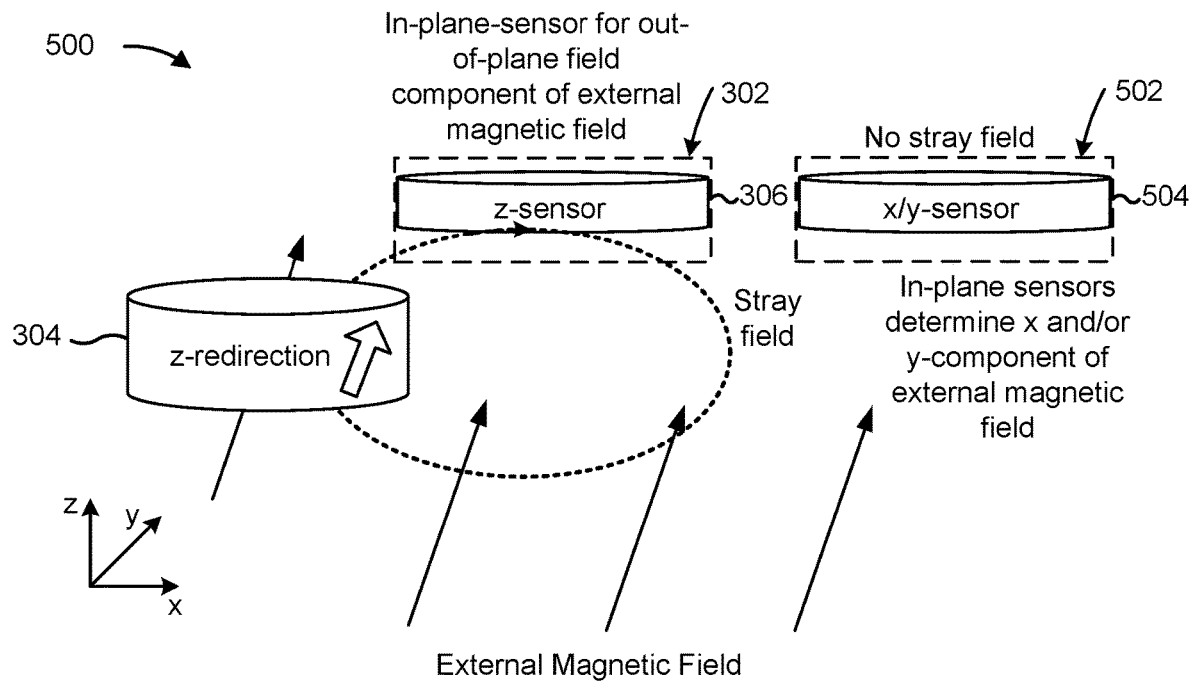

FIG. 5 shows an example of a magnetic sensor system according to one or more implementations.

Figure 6:
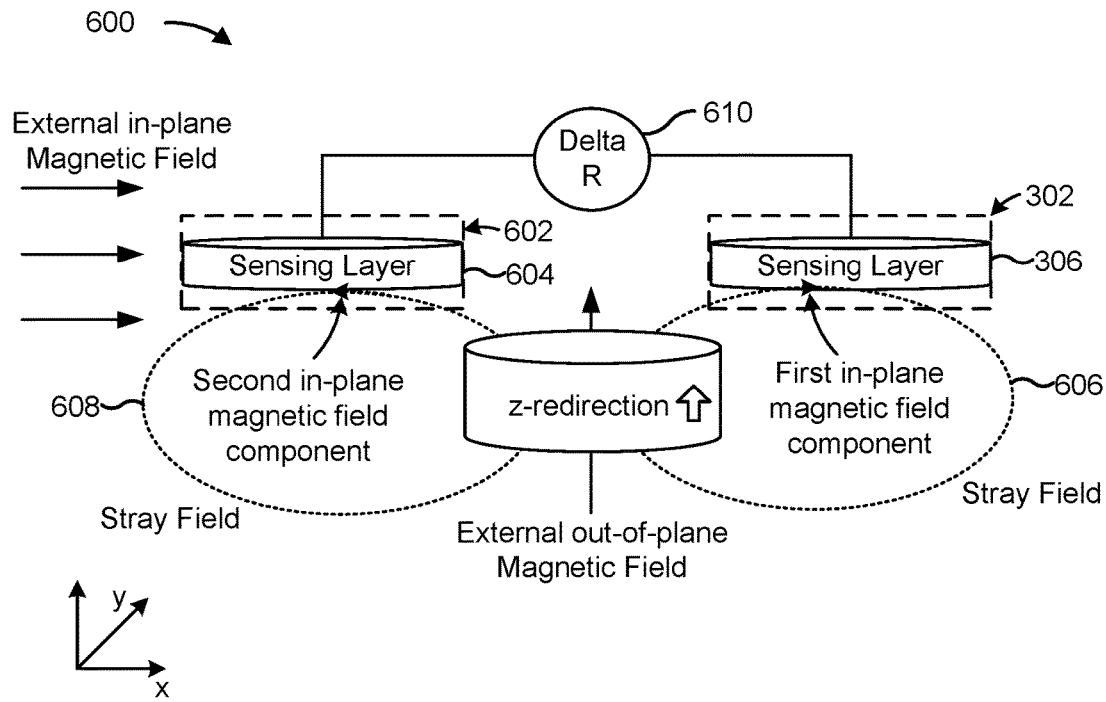

FIG. 6 shows an example of a magnetic sensor system according to one or more implementations.

DETAILED DESCRIPTION

In the following, details are set forth to provide a more thorough explanation of example implementations. However, it will be apparent to those skilled in the art that these implementations may be practiced without these specific details. In other instances, well-known structures and devices are shown in block diagram form or in a schematic view, rather than in detail, in order to avoid obscuring the implementations. In addition, features of the different implementations described hereinafter may be combined with each other, unless specifically noted otherwise.

Further, equivalent or like elements or elements with equivalent or like functionality are denoted in the following description with equivalent or like reference numerals. As the same or functionally equivalent elements are given the same reference numbers in the figures, a repeated description for elements provided with the same reference numbers may be omitted. Hence, descriptions provided for elements having the same or like reference numbers are mutually interchangeable.

Each of the illustrated x-axis, y-axis, and z-axis is substantially perpendicular to the other two axes. In other words, the x-axis is substantially perpendicular to the y-axis and the z-axis, the y-axis is substantially perpendicular to the x-axis and the z-axis, and the z-axis is substantially perpendicular to the x-axis and the y-axis. In some cases, a single reference number is shown to refer to a surface, or fewer than all instances of a part may be labeled with all surfaces of that part. All instances of the part may include associated surfaces of that part despite not every surface being labeled.

The orientations of the various elements in the figures are shown as examples, and the illustrated examples may be rotated relative to the depicted orientations. The descriptions provided herein, and the claims that follow, pertain to any structures that have the described relationships between various features, regardless of whether the structures are in the particular orientation of the drawings, or are rotated relative to such orientation. Similarly, spatially relative terms, such as "top," "bottom," "below," "beneath," "lower," "above," "upper," "middle," "left," and "right," are used herein for ease of description to describe one element's relationship to one or more other elements as illustrated in the figures. The spatially relative terms are intended to encompass different orientations of the element, structure, and/or assembly in use or operation in addition to the orientations depicted in the figures. A structure and/or assembly may be otherwise oriented (rotated 90 degrees or at other orientations), and the spatially relative descriptors used herein may be interpreted accordingly. Furthermore, the cross-sectional views in the figures only show features within the planes of the cross-sections, and do not show materials behind the planes of the cross-sections, unless indicated otherwise, in order to simplify the drawings.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

In implementations described herein or shown in the drawings, any direct electrical connection or coupling (e.g., any connection or coupling without additional intervening elements) may also be implemented by an indirect connection or coupling (e.g., a connection or coupling with one or more additional intervening elements, or vice versa) as long as the general purpose of the connection or coupling (e.g., to transmit a certain kind of signal or to transmit a certain kind of information) is essentially maintained. Features from different implementations may be combined to form further implementations. For example, variations or modifications described with respect to one of the implementations may also be applicable to other implementations unless noted to the contrary.

As used herein, the terms "substantially" and "approximately" mean "within reasonable tolerances of manufacturing and measurement." For example, the terms "substantially" and "approximately" may be used herein to account for small manufacturing tolerances or other factors (e.g., within 5%) that are deemed acceptable in the industry without departing from the aspects of the implementations described herein. For example, a resistor with an approximate resistance value may practically have a resistance within 5% of the approximate resistance value. As another example, a signal with an approximate signal value may practically have a signal value within 5% of the approximate signal value.

In the present disclosure, expressions including ordinal numbers, such as "first", "second", and/or the like, may modify various elements. However, such elements are not limited by such expressions. For example, such expressions do not limit the sequence and/or importance of the elements. Instead, such expressions are used merely for the purpose of distinguishing an element from the other elements. For example, a first box and a second box indicate different boxes, although both are boxes. For further example, a first element could be termed a second element, and similarly, a second element could also be termed a first element without departing from the scope of the present disclosure.

"Sensor" may refer to a component which converts a property to be measured to an electric signal (e.g., a current signal or a voltage signal). The property to be measured may, for example, comprise a magnetic field, an electric field, an electromagnetic wave (e.g., a radio wave), a pressure, a force, a current, or a voltage, but is not limited thereto. For instance, there are various sensor techniques for measuring a current flowing through a conductor or a position of an object in connection with a magnetic field. For example, a system may include a current-carrying conductor that carries a current to be measured. A magnetic field sensor may detect a magnetic field created by the current and generate a sensor signal that is proportional to the magnetic field. Thus, the sensor signal may be a measure for the current.

As another example, a system may include a magnet coupled to a movable target object. The magnet may move relative to a magnetic field sensor as the moveable target object moves along a predetermined path. As the magnet moves closer to the magnetic field sensor, a magnetic field produced by the magnet may become more dense (e.g., more concentrated or stronger) in a region of the magnetic field sensor. Conversely, as the magnet moves farther from the magnetic field sensor, the magnetic field may become less dense (e.g., less concentrated or weaker) in the region of the magnetic field sensor. The magnetic field sensor may detect the magnetic field produced by the magnet and generate a sensor signal that is proportional to the magnetic field. Thus, the sensor signal may be a measure for a position of the magnet relative to the magnetic field sensor.

As another example, a magnet may be coupled to a magnetic field sensor as a back-bias magnet. A movable target object may be configured to influence the magnetic field of the back-bias magnet as the moveable target object moves along a predetermined path. For example, the movable target object may be made of a ferromagnetic material. As a result, the magnetic field may become more dense (e.g., more concentrated or stronger) in a region of the magnetic field sensor as the moveable target object moves closer to the back-bias magnet and may become less dense (e.g., less concentrated or weaker) in the region of the magnetic field sensor as the moveable target object moves farther from the back-bias magnet. The magnetic field sensor may detect the magnetic field produced by the back-bias magnet and generate a sensor signal that is proportional to the magnetic field. Thus, the sensor signal may be a measure for a position of the movable target object relative to the magnetic field sensor.

Due to shape anisotropy, a magnetization of magnetoresistive-based sensors usually lies in-plane. Therefore, the magnetoresistive-based sensors can only detect in-plane magnetic fields (i.e., in-plane B-fields) and cannot detect out-of-plane magnetic fields (i.e., out-of-plane B-fields). An in-plane magnetic field is a magnetic field that is aligned parallel to a chip plane (e.g., a chip surface) of the magnetoresistive-based sensor, whereas an out-of-plane magnetic field is a magnetic field that extends out of the chip plane (e.g., the chip surface) of the magnetoresistive-based sensor. However, in some applications, it may be desired to use magnetoresistive-based sensors to detect and/or measure out-of-plane magnetic field.

Accordingly, some implementations disclosed herein are directed to a magnetic field sensor system that includes a ferromagnetic disc that is configured to redirect an out-of-plane magnetic field via the stray field into a sensing plane of a magnetoresistive-based sensor such that the magnetoresistive-based sensor is capable of measuring the out-of-plane magnetic field. For example, the ferromagnetic disc may have a magnetic vortex in a ground state. In other words, the ferromagnetic disc may have a closed-flux magnetization that is in a vortex state. The magnetic vortex of the ferromagnetic disc may be configured to react linearly to the out-of-plane magnetic field and generate the stray field in response to the out-of-plane magnetic field being applied to the ferromagnetic disc. The stray field may have an in-plane magnetic field component that is proportional to the out-of-plane magnetic field, and a magnetic free layer of the magnetoresistive-based sensor may be configured to receive the in-plane magnetic field component of the stray field such that a magnetically-free magnetization of the magnetic free layer changes based on the in-plane magnetic field component of the stray field. As a result, the ferromagnetic disc enables the magnetoresistive-based sensor to measure the out-of-plane magnetic field by converting the out-of-plane magnetic field into the stray field having the in-plane magnetic field component that can be sensed by the magnetoresistive-based sensor.

The magnetic vortex is generated within the ferromagnetic disc based on a volume of the ferromagnetic disc. A thickness of the ferromagnetic disc may be less than 600 nm while being capable of producing and maintaining the magnetic vortex within the ferromagnetic disc. In addition, a linear stray field response of the magnetic vortex is defined by an aspect ratio of the ferromagnetic disc. The aspect ratio is a ratio between the thickness of the ferromagnetic disc and a diameter of the ferromagnetic disc. Thus, the magnetic vortex provides a linear response to the out-of-plane magnetic field such that the in-plane magnetic field component of the stray field has a linear relationship with the out-of-plane magnetic field. The ability of the magnetic vortex of the ferromagnetic disc to redirect the out-of-plane magnetic field as the in-plane magnetic field component in a linear manner for local B-field redirection enables the ferromagnetic disc to be thin (e.g., to be formed with a thickness at less than 600 nm), which has an advantage over more expensive redirection methods in terms of material costs and manufacturing costs. For example, the ferromagnetic disc may be made out of a soft ferromagnetic material (e.g., iron or an iron-alloy, such as nickel-iron (NiFe)), and the thickness of the ferromagnetic disc may be less than 600 nm, or less than 500 nm, or less than 400 nm, or less than 300 nm, or less than 200 nm, or less than 100 nm. Moreover, the ferromagnetic disc need only be positioned within the out-of-plane magnetic field and close enough to the magnetoresistive-based sensor such that the magnetoresistive-based sensor receives a portion of the stray field that responds linearly to the out-of-plane magnetic field. Thus, the ferromagnetic disc may be easier to integrate into a magnetic field sensor system than other more complicated redirection methods. The easy integration may result in reduced manufacturing costs.

Additionally, homogenous magnetic fields present at a magnetic field sensor may interfere with a magnetic field to be measured. For example, a homogeneous magnetic field may be generated by a nearby current rail that is common in electric vehicles or by another magnetic field source. A homogeneous magnetic field incident on the magnetic field sensor may cause the magnetic field sensor to output a sensor signal that is not an accurate measurement of the magnetic field to be measured. Thus, sensitivity to homogeneous magnetic fields may cause the magnetic field sensor to output unreliable sensor information, which can cause a system that relies on the sensor information to operate incorrectly. Additionally, sensitivity to homogeneous magnetic fields may create an unsafe environment for a user or an object used in connection with the magnetic field sensor when the magnetic field sensor is used in safety-relevant applications. Thus, in some implementations, a magnetic sensor system may be configured to cancel out homogeneous magnetic fields.

Figure 1:
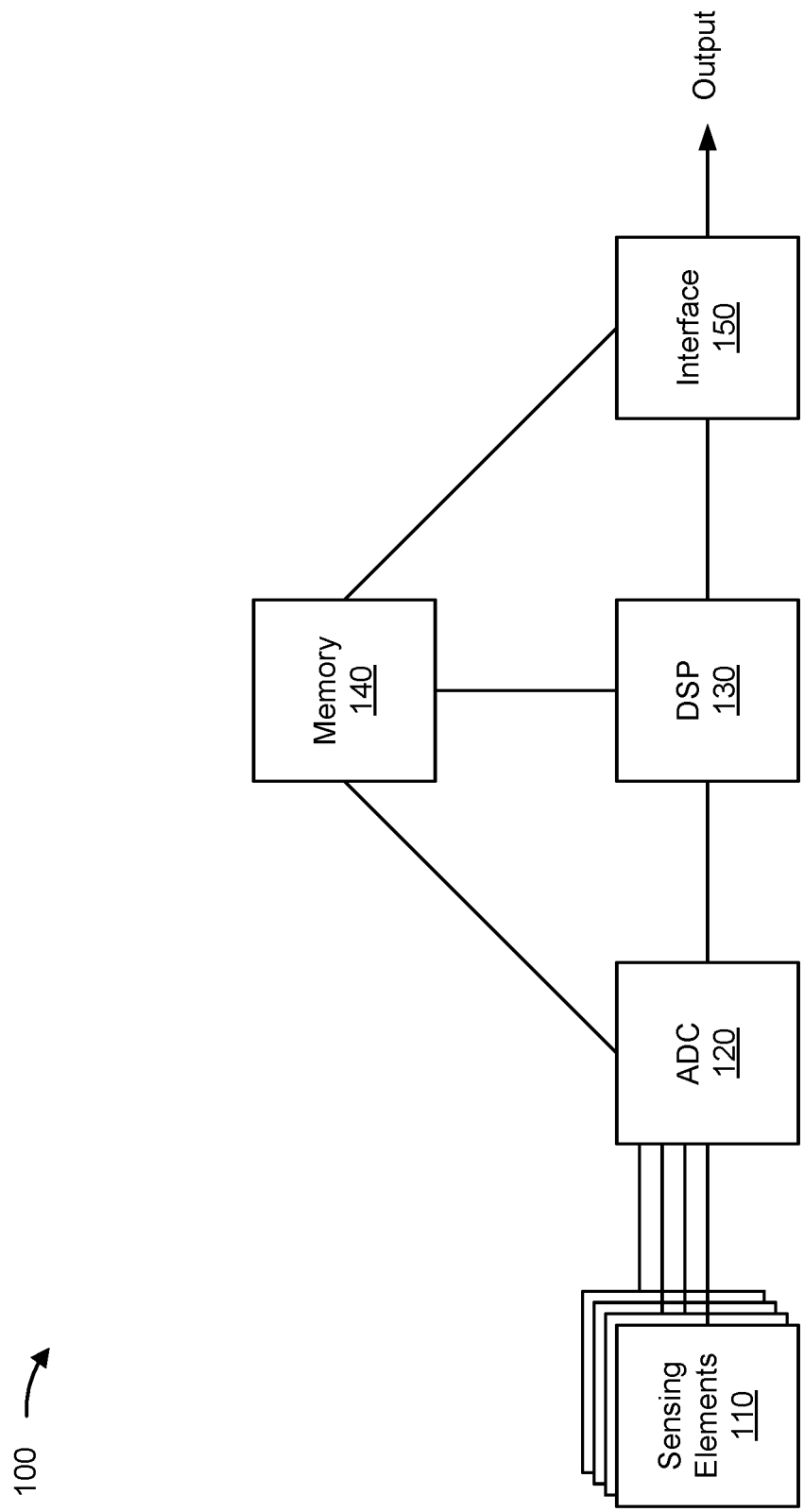
FIG. 1 is a diagram of an example magnetic field sensor according to one or more implementations.

FIG. 1 is a diagram of an example magnetic field sensor 100 according to one or more implementations. As shown in FIG. 1, the magnetic field sensor 100 may include one or more sensing elements 110 (e.g., one or more magnetic field sensing elements), an analog-to-digital convertor (ADC) 120, a digital signal processor (DSP) 130, a memory element 140, and an interface 150.

The magnetic field sensor 100 may be a semiconductor chip (e.g., a sensor chip) that includes the one or more sensing elements 110 that measure or otherwise sense one or more characteristics of a magnetic field (e.g., an amount of magnetic field flux density, a field strength, a field angle, a field direction, a field orientation, etc.) and provide a sensor signal corresponding to the sensed characteristics of the magnetic field. For example, a sensing element 110 may be configured to generate a sensor signal (e.g., a voltage or a measurable resistance) in response to one or more magnetic fields impinging on the sensing element 110. Thus, the sensor signal is indicative of a magnitude and/or a field orientation of at least one magnetic field impinging on the sensing element 110. The semiconductor chip may further include sensor circuitry for processing and outputting one or more sensor signals generated by the one or more sensing elements 110. In some implementations, the sensing elements 110 may be distributed on two or more semiconductor chips.

The magnetic field may be produced by a magnet, a current-carrying conductor (e.g., a wire, a lead frame, or a busbar), the Earth, or another magnetic field source. A sensing element 110 has a "sensitivity axis" or "sensing axis." The sensing element is sensitive to a magnetic field component of a magnetic field that is projected onto or aligned with the sensitivity axis. Moreover, a sensing element 110 is substantially insensitive to magnetic field components of a magnetic field that are not projected onto or aligned with the sensitivity axis. A magnetic field component may be, for example, an x-magnetic field component Bx, a y-magnetic field component By, or a z-magnetic field component Bz. In the examples described herein, the x-magnetic field component Bx and the y-magnetic field component By are aligned in-plane to the semiconductor chip, and the z-magnetic field component Bz is aligned out-of-plane to the semiconductor chip. Accordingly, the x-magnetic field component Bx and the y-magnetic field component By may be referred to as "in-plane" magnetic field components that are aligned parallel to a chip plane (e.g., a chip surface) of the semiconductor chip. In contrast, the z-magnetic field component Bz may be referred to as an "out-of-plane" magnetic field component that extends out of the chip plane (e.g., a chip surface) of the semiconductor chip. For example, the z-magnetic field component Bz extends perpendicular to the chip plane.

In some implementations, the magnetic field sensor 100 includes multiple sensing elements 110 that are sensitive in two or more different directions. For example, the magnetic field sensor 100 may include a first sensing element configured to sense a first magnetic field component (e.g., the x-magnetic field component Bx), a second sensing element configured to sense a second magnetic field component (e.g., the y-magnetic field component By), and a third Hall-based sensing element configured to sense a third magnetic field component (e.g., the z-magnetic field component Bz). That is, in some implementations, the magnetic field sensor 100 may be a 2D magnetic field sensor or a 3D magnetic field sensor that is configured to sense the magnetic field in multiple dimensions.

The sensing elements 110 may include one or more magnetoresistive-based sensing elements (i.e., magnetoresistive sensing elements). Magnetoresistance is a property of a magnetoresistive material (e.g., NiFe) to change a value of its electrical resistance or electrical conductance when a magnetic field is applied to the magnetoresistive material. Thus, the electrical resistance of the magnetoresistive material may depend on a strength and/or a direction of the magnetic field present at the magnetoresistive material. Some examples of various magnetoresistive effects are: giant magneto-resistance (GMR), which is a quantum mechanical magnetoresistance effect observed in thin-film structures composed of alternating ferromagnetic and non-magnetic conductive layers; tunnel magneto-resistance (TMR), which is a magnetoresistive effect that occurs in a magnetic tunnel junction (MTJ), which is a component including two ferromagnets separated by a thin insulator; or anisotropic magneto-resistance (AMR), which is a property of a material in which a dependence of electrical resistance on an angle between a direction of electric current and a direction of magnetization is observed. For example, in the case of AMR sensors, a resistance for an AMR sensing element changes according to a square of a sine of an angle of the magnetic field component projected on the sensitivity axis of the ARM sensing element.

The various magnetoresistive effects are commonly abbreviated as xMR, where the "x" acts as a placeholder for the various magnetoresistive effects. xMR sensors can detect the field orientation of an applied magnetic field by measuring sine and cosine angle components with monolithically integrated magnetoresistive sensing elements.

Magnetoresistive sensing elements of such xMR sensors typically include a plurality of layers, of which at least one layer is a reference layer with a reference magnetization (e.g., a reference direction). The reference magnetization provides a sensing direction that defines the sensitivity axis of a magnetoresistive sensing element. This generally means that the sensitivity axis of the magnetoresistive sensing element is parallel to the chip plane defined by a main surface of the semiconductor chip in which the magnetoresistive sensing element is integrated. As a result, a magnetoresistive sensing element is sensitive to the magnetic field component that extends parallel to, or in-plane with, the main surface of the semiconductor chip. Accordingly, if a magnetic field component points exactly in a same direction as the reference direction, a resistance of the magnetoresistive sensing element is at a minimum and, if the magnetic field component points exactly in the opposite direction with respect to the reference direction, the resistance of the magnetoresistive sensing element is at a maximum.

As a result, the resistance or a voltage drop across the magnetoresistive sensing element resulting from the resistance is proportional to the magnetic field and can be used as the sensor signal of the magnetoresistive sensing element. Moreover, in some implementations, an xMR sensor includes a plurality of magnetoresistive sensing elements, which may have the same or different reference magnetizations.

Accordingly, magnetoresistive sensing elements may be used to measure magnetic fields parallel to the chip plane of the magnetic field sensor 100. Two or more sensing elements and corresponding sensor circuitry may be accommodated (e.g., integrated) in a same semiconductor chip. The sensor circuitry may be referred to as signal processing circuitry and/or signal conditioning circuitry that receives one or more signals (e.g., sensor signals) from one or more sensing elements in the form of raw measurement data, and derives, from the one or more signals, a measurement signal that represents the magnetic field. For example, the sensor circuitry may be configured to condition and amplify the sensor signal of one or more sensing elements 110 via signal processing and/or conditioning.

In some implementations, the sensor circuitry may be configured to combine two or more sensor signals (e.g., by addition, subtraction, or superimposition) to generate a combined sensor signal. For example, a differential sensor signal is one type of combined sensor signal that is representative of a difference between two sensor signals. In some cases, the sensor circuitry may generate the differential sensor signal from the sensor signals generated by two or more sensing elements 110 having a same sensitivity axis (e.g., two sensing elements 110 sensitive to a same magnetic field component) using differential circuitry configured to differentially combine the signals. Sensing elements electrically connected in a half-bridge configuration or in a full-bridge configuration (e.g., a Wheatstone bridge) are examples of differential circuitry that may be used to generate differential sensor signals. Additionally, or alternatively, differential circuitry may include a differential amplifier, an adder, a subtractor, a combiner, logic circuitry, and/or a processor (e.g., a processor that applies differential calculus) to differentially combine the signals to generate a differential sensor signal. Thus, differential sensor signal may by a measurement signal that provides a robustness to homogeneous external stray magnetic fields.

The above-described examples of sensing elements 110 are provided for illustrative purposes and, in practice, the sensing elements 110 may include any type of magnetoresistive sensing element capable of sensing a characteristic of a magnetic field and enabling a sensor signal to be provided to sensor circuitry.

The ADC 120 may include an analog-to-digital converter that converts an analog signal from one or more sensing elements 110 to a digital signal. For example, the ADC 120 may convert analog signals, received from the set of sensing elements 110, into digital signals (e.g., digital samples) to be processed by DSP 130. The ADC 120 may provide the digital signals to DSP 130. In some implementations, magnetic field sensor 100 may include one or more ADCs 120. For example, different ADCs 120 may be configured to receive analog signals from different sets of sensing elements 110.

The DSP 130 may include a digital signal processing device or a collection of digital signal processing devices. In some implementations, the DSP 130 may receive digital signals from the ADC 120 and may process the digital signals to form output signals (e.g., destined for a controller), such as an output signal that conveys sensor data, as described elsewhere herein. In some implementations, the output signals may be referred to as measurement signals.

The memory element 140 may include a read-only memory (ROM) (e.g., an EEPROM), a random-access memory (RAM), and/or another type of dynamic or static storage device (e.g., a flash memory, a magnetic memory, an optical memory, etc.) that stores information and/or instructions for use by magnetic field sensor 100. In some implementations, the memory element 140 may store information associated with processing performed by DSP 130. Additionally, or alternatively, the memory element 140 may store configurational values or parameters for the one or more sensing elements 110 and/or information for one or more other components of magnetic field sensor 100, such as the ADC 120 or the interface 150.

The interface 150 may include an interface via which magnetic field sensor 100 may receive and/or provide information from and/or to another device in a system, such as a controller. For example, the interface 150 may provide the output signal, determined or otherwise generated by DSP 130, to the controller, and may further receive information from the controller. In some implementations, the interface 150 may be a communication interface that receives the output signals from the DSP 130 and provides the output signals as communication signals according to a communication protocol, which may include transmitting the output signals as the communication signals or generating the communication signals based on the output signals.

As indicated above, FIG. 1 is provided as an example. Other examples may differ from what is described with regard to FIG. 1. The number and arrangement of components shown in FIG. 1 are provided as an example. In practice, the magnetic field sensor 100 may include additional components, fewer components, different components, or differently arranged components than those shown in FIG. 1. Two or more components shown in FIG. 1 may be implemented within a single component, or a single component shown in FIG. 1 may be implemented as multiple, distributed components. Additionally, or alternatively, a set of components (e.g., one or more components) of the magnetic field sensor 100 may perform one or more functions described as being performed by another set of components of the magnetic field sensor 100.

FIG. 2 shows an example of a layer stack of a magnetoresistive sensing element 200 according to one or more implementations. For example, the magnetoresistive sensing element 200 may be a TMR sensing element with a bottom-pinned spin-valve (BSV) configuration. Additionally, the magnetoresistive sensing element 200 can be arranged on a semiconductor substrate (not shown) of a magnetoresistive sensor. If described in a Cartesian coordinate system with pair-wise perpendicular coordinate axes x, y, and z, layers of the layer stack extend laterally in a plane spanned by the x and y axes. Thus, lateral dimensions (e.g., lateral distances, lateral cross-sectional areas, lateral areas, lateral extensions, lateral displacements, etc.) may refer to dimensions in the xy-plane and vertical dimensions may refer to dimensions in a z-direction, perpendicular to the xy-plane. For example, a vertical extent of a layer in the z-direction may be described as a layer thickness.

The layer stack of the magnetoresistive sensing element 200 includes at least one reference layer with a reference magnetization (e.g., a reference direction in the case of GMR or TMR technology). The reference magnetization is a magnetization direction that provides a sensing direction corresponding to a sensing axis of the magnetoresistive sensing element 200. The reference layer, and consequently the reference magnetization, defines a sensor plane. For example, the sensor plane may be defined by the xy-plane. Thus, the x-direction and the y-direction may be referred to as "in-plane" with respect to the sensor plane and the z-direction may be referred to as "out-of-plane" with respect to the sensor plane.

Accordingly, in the case of a GMR sensing element or a TMR sensing element, if a magnetically-free magnetization of a magnetic free layer points exactly in a same direction as the reference magnetization (e.g., the reference direction), a resistance of the magnetoresistive sensing element 200 is at a minimum and, if the magnetically-free magnetization of the magnetic free layer points exactly in an opposite direction as the reference magnetization, the resistance of the magnetoresistive sensing element 200 is at a maximum. An orientation of the magnetically-free magnetization of the magnetic free layer is variable in a presence of an external magnetic field. In a magnetoresistive sensing element with a magnetic vortex free layer, the magnetically-free magnetization of the magnetic free layer is in the form of a magnetic vortex, which is a circular pattern of magnetization with a core in the center. When the external magnetic field is applied to the magnetic free layer, the external magnetic field can shift the core of the magnetic vortex and change the resistance or the conductance of the magnetoresistive sensing element. Thus, the resistance or the conductance of the magnetoresistive sensing element 200 can vary based on an influence of the external magnetic field on the magnetically-free magnetization of the magnetic free layer.

From the bottom up, the magnetoresistive sensing element 200 may comprise an optional seed layer 202 that may be used to influence and/or optimize a stack growth. In some implementations, the seed layer 202 may be copper, tantalum, ruthenium, or a combination thereof. A natural antiferromagnetic (NAF) layer 204 is formed or otherwise disposed on the seed layer 202. The NAF layer 204 may be made of platinum-manganese (PtMn), iridium-manganese (IrMn), nickel-manganese (NiMn), or the like. A film thickness of the NAF can be in the range of 5 nm to 50 nm.

In addition, a pinned layer (PL) 206 may be formed or otherwise disposed on the NAF layer 204. The pinned layer 206 may be made of a ferromagnetic material, such as cobalt-iron (CoFe) or cobalt-iron-boron (CoFeB). Contact between the NAF layer 204 and the pinned layer 206 can provoke an effect known as an exchange bias effect, causing a magnetization of the pinned layer 206 to align in a preferred direction (e.g., in the x-direction, as shown). The magnetization of the pinned layer 206 may be referred to as a pinned magnetization. The pinned layer 206 can comprise a closed-flux magnetization pattern in the xy-plane. This closed-flux magnetization pattern of the pinned layer 206 may be generated during manufacturing of the magnetoresistive sensing element 200 and may be permanently fixed. Alternatively, the pinned layer 206 can comprise a linear magnetization pattern in the xy-plane (e.g., a homogenous orientation in one direction) that is permanently fixed.

The magnetoresistive sensing element 200 further comprises a non-magnetic layer (NML) referred to as coupling interlayer 208. The coupling interlayer 208 may be diamagnetic and may comprise ruthenium, iridium, copper, copper alloys, or similar materials, for example. A magnetic (e.g., ferromagnetic) reference layer (RL) 210 may be formed or otherwise disposed on the coupling interlayer 208. Thicknesses of the pinned layer 206 and the magnetic reference layer 210, respectively, may be in the range of 1 nm to 10 nm.

Accordingly, the coupling interlayer 208 may be arranged between the pinned layer 206 and the magnetic reference layer 210 in order to spatially separate the pinned layer 206 and the magnetic reference layer 210 in the vertical direction. In addition, the coupling interlayer 208 may provide an interlayer exchange coupling (e.g., an antiferromagnetic Ruderman-Kittel-Kasuya-Yosida (RKKY) coupling) between the pinned layer 206 and the magnetic reference layer 210 to form an artificial antiferromagnet. As a result, a magnetization of the magnetic reference layer 210 may align and be held in a direction anti-parallel or opposite to the magnetization of the pinned layer 206 (e.g., in the −x-direction, as shown). The magnetization of the magnetic reference layer 210 may be referred to as a reference magnetization.

Since the NAF layer 204 is configured to cause the magnetization of the pinned layer 206 to align and be fixed in a certain direction, and the coupling interlayer 208 is configured to cause the magnetization of the magnetic reference layer 210 to align and be fixed in an opposite direction, it can be said that the NAF layer 204 is configured to hold the magnetization of the pinned layer 206 (e.g., a fixed pinned magnetization) in a first magnetic orientation and hold the magnetization of the magnetic reference layer 210 (e.g., a fixed reference magnetization) in a second magnetic orientation. For example, if the pinned layer 206 comprises a linear magnetization pattern in the xy-plane in a certain direction, the magnetic reference layer 210 may comprise a linear magnetization pattern in an anti-parallel direction. Thus, the NAF layer 204, the pinned layer 206, the coupling interlayer 208, and the magnetic reference layer 210 form a magnetic reference layer system 212 of the magnetoresistive sensing element 200.

The magnetoresistive sensing element 200 additionally comprises a barrier layer 214 (e.g., a tunnel barrier layer) arranged vertically between the reference layer system 212 and a magnetic free layer 216. For example, the barrier layer 214 may be formed or otherwise disposed on the magnetic reference layer 210 of the reference layer system 212, and the magnetic free layer 216 may be formed or otherwise disposed on the barrier layer 214.

The barrier layer 214 may be composed of a non-magnetic material. In some implementations, the barrier layer 214 may be an electrically insulating tunnel barrier layer. For example, the barrier layer 214 may be a tunnel barrier layer used for producing a TMR effect. The barrier layer 214 may comprise magnesium oxide (MgO) or another material with similar properties.

A material of the magnetic free layer 216 can be an alloy of a ferromagnetic material, such as CoFe, CoFeB, or NiFe. The magnetic free layer 216 has a magnetically-free magnetization that is variable in a presence of an external in-plane magnetic field. Therefore, the magnetic free layer 216 may be referred to as a sensor layer, since changes in the magnetically-free magnetization are used to determine a measured variable (e.g., the electrical resistance or electrical conductance of the magnetoresistive sensing element 200). In addition, the magnetically-free magnetization has a default magnetic orientation in a ground state. The ground state is a state in which an influence of the external in-plane magnetic field on the magnetic free layer 216 is absent or negligibly small. In some implementations, the magnetoresistive sensing element 200 may include a magnetically-free system that includes a plurality of layers (e.g., two or more magnetic free layers), which act in combination as the magnetically-free layer. In this case, the magnetically-free layers of the magnetically-free system are magnetically coupled to each other. Thus, the magnetically-free system can act as the magnetically-free layer, but may comprise a plurality of layers. The magnetically-free system has a magnetically-free magnetization, wherein the magnetically-free magnetization is variable in the presence of the external in-plane magnetic field.

The magnetically-free magnetization of the magnetic free layer 216 may be a magnetic vortex free layer with a closed-flux magnetization that is in a vortex state. In other words, a magnetization pattern of the magnetically-free magnetization may form a closed loop. As a result, the magnetoresistive sensing element 200 has an electrical conductance or an electrical resistance, and the magnetoresistive sensing element 200 may be configured to exhibit a linear change in the electrical conductance or the electrical resistance, that is proportional to the external in-plane magnetic field, based on a linear change of the magnetically-free magnetization of the magnetic free layer 216 that is responsive to (e.g., proportional to) the external in-plane magnetic field. Thus, the magnetoresistive sensing element 200 may be a linear magnetoresistive sensor having a linear sensor response to the external in-plane magnetic field.

A cap layer 218 made of, for example, tantalum (Ta), tantalum-nitride (TaN), ruthenium (Ru), titanium (Ti), titanium nitride (TiN), platinum (Pt), or the like, may be formed or otherwise disposed on the magnetic free layer 216 to form an upper layer of the magnetoresistive sensing element 200.

The seed layer 202 may serve as a bottom electrode or may provide electrical contact with a bottom electrode (not shown) of the magnetoresistive sensing element 200. The cap layer 218 may provide electrical contact with a top electrode (not shown) of the magnetoresistive sensing element 200. The barrier layer 214 may be designed to permit electrons to tunnel between the reference layer system 212 and the magnetic free layer 216 when a bias voltage is applied to electrodes of the magnetoresistive sensing element 200 (not shown) in order to provide a magnetoresistance effect (e.g., a TMR effect).

As indicated above, FIG. 2 is provided merely as an example. Other examples may differ from what is described with regard to FIG. 2. The number and arrangement of components shown in FIG. 2 are provided as an example. In practice, the magnetoresistive sensing element 200 may include additional elements, fewer elements, different elements, or differently arranged elements than those shown in FIG. 2.

FIG. 3 shows an example of a magnetic sensor system 300 according to one or more implementations. The magnetic sensor system 300 may include a magnetoresistive sensor 302 and a ferromagnetic disc 304 that is spatially separated from the magnetoresistive sensor 302. The magnetoresistive sensor 302 may be a magnetoresistive sensing element similar to the magnetoresistive sensing element 200 described in connection with FIG. 2. Thus, the magnetoresistive sensor 302 may be a linear magnetoresistive sensor that has a magnetic vortex free layer as a magnetic free layer 306. The magnetic free layer 306 is used as a sensing layer for sensing in-plane magnetic fields. For example, the magnetic free layer 306 may have a sensing plane (e.g., an xy-plane) and a magnetically-free magnetization arranged within the sensing plane. Additionally, the magnetically-free magnetization is variable in a presence of an in-plane magnetic field that is aligned with the sensing plane (e.g., that is aligned with a sensitivity axis of a magnetic reference layer (not explicitly illustrated)).

The ferromagnetic disc 304 may be made of a soft magnetic material and may have a magnetic vortex in a ground state. Thus, the ferromagnetic disc 304 may have a closed-flux magnetization that is in a vortex state. The ferromagnetic disc 304 is configured to react to an out-of-plane magnetic field, such as a magnetic field that is out-of-plane to the sensing plane, and generate a stray field in response to the out-of-plane magnetic field being applied to the ferromagnetic disc 304. In some implementations, the out-of-plane magnetic field may be a Bz field that is aligned in the z-direction that is orthogonal to the sensing plane. The stray field generated by the magnetic vortex of the ferromagnetic disc 304 may include an in-plane magnetic field component that is proportional to the out-of-plane magnetic field. In other words, the ferromagnetic disc 304 may be configured to convert the out-of-plane magnetic field into the stray field having the in-plane magnetic field component.

As a result, the ferromagnetic disc 304 may be configured to redirect the out-of-plane magnetic field, as the stray field, into the sensing plane of the magnetic free layer 306 such that the in-plane magnetic field component of the stray field is aligned, in-plane, with the sensing plane of the magnetic free layer 306.

In addition, the magnetic vortex provides a linear response (e.g., a linear stray field response) to the out-of-plane magnetic field such that the in-plane magnetic field component of the stray field has a linear relationship with the out-of-plane magnetic field. Thus, the ferromagnetic disc 304 generates the in-plane magnetic field component of the stray field from the out-of-plane magnetic field based on a linear response function, and the in-plane magnetic field component of the stray field has a linear relationship with the out-of-plane magnetic field based on the linear response function.

The magnetic free layer 306 is configured to receive the in-plane magnetic field component of the stray field, and the magnetically-free magnetization of the magnetic free layer 306 is configured to change based on the in-plane magnetic field component of the stray field. That is, the magnetic free layer 306 is positioned in a location at which the in-plane magnetic field component of the stray field is expected to be present. Since the change in the magnetically-free magnetization is proportional to the in-plane magnetic field component, and the in-plane magnetic field component is proportional to the out-of-plane magnetic field, the change in the magnetically-free magnetization is also proportional to the out-of-plane magnetic field. Thus, the change in the magnetically-free magnetization may represent an amount of magnetic field flux density or a field strength of the out-of-plane magnetic field.

An aspect ratio between a thickness and a diameter of the ferromagnetic disc 304 defines a linear range portion of the stray field. The linear range portion of the stray field responds to the out-of-plane magnetic field in a linear manner based on the linear response function. The magnetically-free magnetization of the magnetic free layer 306 responds in a linear manner to the linear range portion of the stray field. Thus, the magnetic free layer 306 should be positioned in a location at which the in-plane magnetic field component of the stray field has a linear response to the out-of-plane magnetic field.

The magnetic vortex of the ferromagnetic disc 304 is generated within the ferromagnetic disc 304 based on a volume of the ferromagnetic disc 304 and can be generated using a relatively thin soft ferromagnetic layer. For example, the thickness of the ferromagnetic disc may be less than 600 nm, or less than 500 nm, or less than 400 nm, or less than 300 nm, or less than 200 nm, or less than 100 nm. In addition, the linear stray field response of the magnetic vortex is defined by the aspect ratio of the ferromagnetic disc 304. The ability of the magnetic vortex of the ferromagnetic disc 304 to redirect the out-of-plane magnetic field as the in-plane magnetic field component in a linear and hysteresis free manner for local B-field redirection enables the ferromagnetic disc 304 to be kept thin. Moreover, the ferromagnetic disc 304 does not generate a measurable stray field at the magnetic free layer 306 when no external magnetic field is applied to the ferromagnetic disc 304. The stray field may decay rapidly with an increasing distance from the ferromagnetic disc 304 depending on the volume of the ferromagnetic disc 304.

The magnetoresistive sensor 302 has an electrical conductance or an electrical resistance that varies based on changes in the magnetically-free magnetization of the magnetic free layer 306. Thus, the magnetoresistive sensor 302 is configured to exhibit a linear change, in the electrical conductance or the electrical resistance, that is proportional to the out-of-plane magnetic field, based on a change of the magnetically-free magnetization of the magnetic free layer 306 that is responsive to the in-plane magnetic field component of the stray field. A sensor circuit may be used to read out or measure the electrical conductance or the electrical resistance of the magnetoresistive sensor 302.

The number and arrangement of components shown in FIG. 3 are provided as an example. In practice, the magnetic sensor system 300 may include additional components, fewer components, different components, or differently arranged components than those shown in FIG. 3.

FIG. 4A shows an example of a diagram 400A of a magnetization of a ferromagnetic disc according to one or more implementations. The diagram 400A plots a relative out-of-plane (oop) magnetization ($m_{oop}$) of the ferromagnetic disc 304 depending on an external out-of-plane magnetic field ($\mu_0 H_{OOP}$). In this example, the ferromagnetic disc has a 500 nm diameter that is held constant for different thicknesses of the ferromagnetic disc. The aspect ratio (thickness/diameter) defines the shape anisotropy and hence the slope of the magnetization curve. The generated stray field is directly proportional to the magnetization.

A linear region of the stray field response of the ferromagnetic disc depends on the aspect ratio of the ferromagnetic disc. Therefore, the linear stray field response of the ferromagnetic disc can be controlled with the aspect ratio. Since the diameter is held constant in this example, the linear region of the stray field response depends on the thickness of the ferromagnetic disc. The diagram 400A shows that a smaller thickness of the ferromagnetic disc results in a larger linear region for the stray field response. Thus, the thickness of the ferromagnetic disc may be less than 500 nm while providing a linear stray field response to be used for measuring the out-of-plane magnetic field. In addition, sensitivity of the ferromagnetic disc to the out-of-plane magnetic field can be increased at the cost of linear range.

As indicated above, FIG. 4A is provided as an example. Other examples may differ from what is described with regard to FIG. 4A.

FIG. 4B shows an example of a diagram 400B of a decay response of an in-plane magnetic field component of a stray field according to one or more implementations. The diagram 400B plots a change in a magnetic flux density (mT) of an in-plane magnetic field component of a stray field relative to a distance ($\mu m$) along a sensitivity axis direction of a magnetoresistive sensor. The diagram 400B shows three plots for three different z-distances between the magnetoresistive sensor and a ferromagnetic disc (e.g., ferromagnetic disc 304).

The stray field generated by the ferromagnetic disc from an out-of-plane magnetic field decays, in some cases rapidly, with an increasing distance in the sensitivity axis direction from the ferromagnetic disc. Thus, a magnetoresistive sensor should be placed in a location where the stray field of the ferromagnetic disc 304 can be detected. For example, a 500 nm (diameter) by 300 nm (thick) ferromagnetic disc may saturate at 500 mT out-of-plane field. At a distance of approximately 500 nm, the in-plane component of the stray field may be about 50 mT. Thus, about 10% of the external out-of-plane magnetic field can be redirected in this example.

As indicated above, FIG. 4B is provided as an example. Other examples may differ from what is described with regard to FIG. 4B.

FIG. 5 shows an example of a magnetic sensor system 500 according to one or more implementations. The magnetic sensor system 500 may be used to measure an out-of-plane magnetic field (e.g., an out-of-plane magnetic field component of an external magnetic field) when an external magnetic field has an out-of-of plane magnetic field component and at least one in-plane magnetic field component. The magnetic sensor system 500 may include the magnetoresistive sensor 302 and the ferromagnetic disc 304, as described in connection with the magnetic sensor system 300 of FIG. 3. In addition, the magnetic sensor system 500 may include an additional magnetoresistive sensor 502 that has a magnetic free layer 504 (e.g., a sensing layer) with a magnetically-free magnetization (e.g., a magnetic vortex). The external magnetic field may be a homogeneous magnetic field that extends through both the magnetoresistive sensor 302 and the magnetoresistive sensor 502.

The magnetoresistive sensor 502 may be similar to the magnetoresistive sensor 302, with a similar layer stack and with similar magnetizations within the layers of the layer stack. For example, the magnetoresistive sensor 302 and the magnetoresistive sensor 502 may each have a magnetic vortex free layer and a magnetic reference layer with a fixed reference magnetization aligned with a same in-plane axis (e.g., an x-axis or a y-axis). Since the fixed reference magnetization defines a sensitivity axis of a magnetoresistive sensor, both the magnetoresistive sensor 302 and the magnetoresistive sensor 502 may have a sensitivity axis aligned with the same in-plane axis. As a result, both the magnetoresistive sensor 302 and the magnetoresistive sensor 502 are insensitive to out-of-plane magnetic fields.

To summarize, the magnetoresistive sensor 302 may have a first sensitivity axis and the magnetic free layer 306 may have a first magnetically-free magnetization that is variable in a presence of an in-plane magnetic field that is aligned with the first sensitivity axis. The magnetoresistive sensor 502 may have a second sensitivity axis and the magnetic free layer 504 may have a second magnetically-free magnetization that is variable in a presence of the in-plane magnetic field that is aligned with the second sensitivity axis. In some implementations, the first sensitivity axis and the second sensitivity axis are aligned with the same in-plane axis (e.g., an x-axis or a y-axis). In the example illustrated in FIG. 5, the first sensitivity axis and the second sensitivity axis are aligned with the x-axis.

The ferromagnetic disc 304 has a magnetic vortex that is configured to react to an out-of-plane magnetic field (or an out-of-plane magnetic field component) and generate a stray field in response to the out-of-plane magnetic field being applied to the ferromagnetic disc 304. The in-plane magnetic field component of the stray field may be aligned with the first sensitivity axis of the magnetoresistive sensor 302.

The magnetoresistive sensor 302 may be arranged within the stray field to receive the in-plane magnetic field component of the stray field that is generated from the out-of-plane magnetic field. Thus, the magnetically-free magnetization of the magnetoresistive sensor 302 may be configured to change based on the in-plane magnetic field component of the stray field. However, since the magnetoresistive sensor 302 will receive both the external magnetic field, which has its own in-plane magnetic field or in-plane magnetic field component, and the in-plane magnetic field component of the stray field, the magnetically-free magnetization of the magnetic free layer 306 may react to both the external magnetic field and the in-plane magnetic field component of the stray field. In the case that the magnetically-free magnetization of the magnetic free layer 306 reacts to both the external magnetic field and the in-plane magnetic field component of the stray field, the in-plane magnetic field component of the stray field would not be distinguishable from the in-plane magnetic field component of the external magnetic field when reading out a sensor value of the magnetoresistive sensor 302. As a result, the out-of-plane magnetic field (or an out-of-plane magnetic field component) of the external magnetic field would not be able to be measured based solely on the magnetoresistive sensor 302.

Since the stray field decays with an increasing distance from the ferromagnetic disc 304, the magnetoresistive sensor 502 may be arranged at a sufficient distance from the ferromagnetic disc 304 that the magnetoresistive sensor 502 is outside of the stray field. In other words, the magnetoresistive sensor 502 may be arranged within the external magnetic field, such that the magnetoresistive sensor 502 reacts to the in-plane magnetic field component of the external magnetic field, but outside of the stray field such that the magnetoresistive sensor 502 does not react to the in-plane magnetic field component of the stray field. In other words, the magnetically-free magnetization of the magnetic free layer 504 may react solely to the in-plane magnetic field component of the external magnetic field. In some implementations, the magnetoresistive sensor 302 and the magnetoresistive sensor 502 may be arranged at a same lateral side of the ferromagnetic disc 304 with different lateral distances from the ferromagnetic disc 304.

The magnetoresistive sensor 302 has a first electrical resistance (or a first electrical conductance) that varies based on changes in the magnetic free layer 306. The magnetoresistive sensor 502 has a second electrical resistance (or a second electrical conductance) that varies based on changes in the magnetic free layer 504. The magnetic free layer 306 is configured to change based on the in-plane magnetic field component of the external magnetic field and the in-plane magnetic field component of the stray field such that the first electrical resistance has a first resistance component corresponding to the in-plane magnetic field component of the stray field and a second resistance component corresponding to the in-plane magnetic field component of the external magnetic field. The magnetic free layer 504 is configured to change based solely on the in-plane magnetic field component of the external magnetic field such that a total resistance of the second electrical resistance corresponds to the in-plane magnetic field component of the external magnetic field.

The magnetic sensor system 500 further comprises sensor circuitry, as similarly described in connection with FIG. 1, that is configured to measure the first electrical resistance and the second electrical resistance such that the second resistance component is negated by the second electrical resistance. For example, the sensor circuitry may subtract the second electrical resistance from the first electrical resistance such that only the first resistance component of the first electrical resistance remains. In this way, a sensor value corresponding only to the in-plane magnetic field component of the stray field can be isolated from the influence of the in-plane magnetic field component of the external magnetic field. Thus, the sensor circuitry may be configured to generate a sensor signal representative only of the first resistance component corresponding to the in-plane magnetic field component of the stray field, which is proportional to the out-of-plane component of the external magnetic field.

In some implementations, the magnetic sensor system 500 may be used as a two-dimensional (2D) sensor or a three-dimensional (3D) sensor. The magnetoresistive sensor 302 may be referred to as an out-of-plane sensor or z-sensor because the magnetoresistive sensor 302 is used for measuring the out-of-plane component of the external magnetic field (e.g., Bz). The magnetoresistive sensor 502 may be used to measure an in-plane component of the external magnetic field (e.g., Bx). In other words, the electrical resistance of the magnetoresistive sensor 502 may be used as a sensor value for the x-magnetic field component Bx of the external magnetic field when the sensitivity axis of the magnetoresistive sensor 502 is aligned with the x-axis, or as a sensor value for the y-magnetic field component By of the external magnetic field when the sensitivity axis of the magnetoresistive sensor 502 is aligned with the y-axis. Thus, the magnetoresistive sensor 502 may be referred to as an in-plane sensor, an x-sensor, or a y-sensor because the magnetoresistive sensor 502 is used for measuring an in-plane component of the external magnetic field (e.g., Bx or By).

One or more magnetoresistive sensors may be added to measure a third dimension of the external magnetic field. For example, if the sensitivity axes of the magnetoresistive sensor 302 and the magnetoresistive sensor 502 are aligned with the x-axis, two additional magnetoresistive sensors having sensitivity axes aligned with the y-axis may be added. One of the additional magnetoresistive sensors, used as an out-of-plane sensor for measuring Bz, may be arranged within the stray field, and the other one of the additional magnetoresistive sensors, used as an in-plane sensor for measuring By, may be arranged outside of the stray field, similar to the magnetoresistive sensors 302 and 502. In some implementations, only one magnetoresistive sensor arranged outside of the stray field and having a sensitivity axis aligned with the y-axis may be added for measuring the y-magnetic field component By of the external magnetic field.

As indicated above, FIG. 5 is provided as an example. Other examples may differ from what is described with regard to FIG. 5. The number and arrangement of components shown in FIG. 5 are provided as an example. In practice, the magnetic sensor system 500 may include additional components, fewer components, different components, or differently arranged components than those shown in FIG. 5. Two or more components shown in FIG. 5 may be implemented within a single component, or a single component shown in FIG. 5 may be implemented as multiple, distributed components. Additionally, or alternatively, a set of components (e.g., one or more components) of the magnetic sensor system 500 may perform one or more functions described as being performed by another set of components of the magnetic sensor system 500.

FIG. 6 shows an example of a magnetic sensor system 600 according to one or more implementations. The magnetic sensor system 600 may be used to measure an external out-of-plane magnetic field (e.g., Bz) when an external in-plane magnetic field (e.g., Bx) is also present. The magnetic sensor system 600 may include the magnetoresistive sensor 302 and the ferromagnetic disc 304, as described in connection with the magnetic sensor system 300 of FIG. 3. In addition, the magnetic sensor system 600 may include an additional magnetoresistive sensor 602 that has a magnetic free layer 604 (e.g., a sensing layer) with a magnetically-free magnetization (e.g., a magnetic vortex). The external in-plane magnetic field may be a homogeneous magnetic field that extends through both the magnetoresistive sensor 302 and the magnetoresistive sensor 602.

The external out-of-plane magnetic field may be applied to the ferromagnetic disc 304, which has a magnetic vortex that is configured to react to the out-of-plane magnetic field and generate a stray field in response to the external out-of-plane magnetic field being applied to the ferromagnetic disc 304. The stray field is shown to have two lobes that extend from the ferromagnetic disc 304 in opposite lateral directions. Both lobes are proportional to the external out-of-plane magnetic field due to a linear stray field response of the magnetic vortex of the ferromagnetic disc 304.

In particular, the stray field may have a first lobe 606 that extends to the right side of the ferromagnetic disc 304 in a clockwise pattern and a second lobe 608 that extends to the left side of the ferromagnetic disc 304 in a counterclockwise pattern. The first lobe 606 has a first in-plane magnetic field component that has a first vector in a first direction (e.g., a positive x-direction) that is aligned with a sensitivity axis of the magnetoresistive sensor 302. Moreover, the first lobe 606 and the first in-plane magnetic field component are proportional to the external out-of-plane magnetic field. The second lobe 608 has a second in-plane magnetic field component that has a second vector in a second direction (e.g., a negative x-direction) that is aligned with a sensitivity axis of the magnetoresistive sensor 602. Moreover, the second lobe 608 and the second in-plane magnetic field component are proportional to the external out-of-plane magnetic field. Thus, the first vector of the first in-plane magnetic field component is antiparallel to the second vector of the second in-plane magnetic field component.

The magnetoresistive sensor 302 and the magnetoresistive sensor 602 are located at opposite lateral sides of the ferromagnetic disc 304. For example, the magnetoresistive sensor 302 may be arranged within the first lobe 606 of the stray field at a location suitable for measuring the first in-plane magnetic field component, and the magnetoresistive sensor 602 may be arranged within the second lobe 608 of the stray field at a location suitable for measuring the second in-plane magnetic field component.

The magnetoresistive sensor 302 includes a first sensitivity axis and a first magnetic free layer 306 having a first magnetically-free magnetization that is variable in a presence of the external in-plane magnetic field and the first in-plane magnetic field component of the stray field that are aligned with the first sensitivity axis. In other words, the first magnetically-free magnetization may react to both the external in-plane magnetic field and the first in-plane magnetic field component of the stray field.

The magnetoresistive sensor 602 includes a second sensitivity axis and a second magnetic free layer 604 having a second magnetically-free magnetization that is variable in a presence of the external in-plane magnetic field and the second in-plane magnetic field component of the stray field that are aligned with the second sensitivity axis. In other words, the second magnetically-free magnetization may react to both the external in-plane magnetic field and the second in-plane magnetic field component of the stray field.

The first sensitivity axis of the magnetoresistive sensor 302 may be parallel to the second sensitivity axis of the magnetoresistive sensor 602 so that the magnetoresistive sensor 302 and the magnetoresistive sensor 602 are sensitive to the same in-plane magnetic field component and react in a same manner with regard to a magnetic field directed in a same direction (e.g., a positive x-direction). For example, when the external in-plane magnetic field is applied to both magnetoresistive sensor 302 and the magnetoresistive sensor 602, the external in-plane magnetic field extends through both the magnetoresistive sensor 302 and the magnetoresistive sensor 602 in a same direction (e.g., a positive x-direction). The magnetoresistive sensor 302 and the magnetoresistive sensor 602 may undergo respective changes in resistance from the external in-plane magnetic field that are equal in magnitude. Thus, the respective changes in resistance of the magnetoresistive sensor 302 and the magnetoresistive sensor 602 resultant from the external in-plane magnetic field may be canceled out or negated when read out by sensor circuitry 610 (e.g., by subtraction or differential processing).

In contrast, the magnetoresistive sensor 302 and the magnetoresistive sensor 602 may be sensitive to the same in-plane magnetic field component, but react in an opposite manner with regard to magnetic fields directed in opposite directions along the x-axis. Since the first in-plane magnetic field component and the second in-plane magnetic field component of the stray field are directed in opposite directions, the magnetoresistive sensor 302 and the magnetoresistive sensor 602 may undergo respective changes in resistance from the stray field that are equal, but opposite in sign. When subtraction or differential processing is applied to the sensor signals of the magnetoresistive sensor 302 and the magnetoresistive sensor 602, the respective changes in resistance from the stray field may be summed together (e.g., due to opposite sign values being subtracted). Thus, the magnetoresistive sensor 302 is arranged within the first in-plane magnetic field component of the stray field to detect the first vector, and the magnetoresistive sensor 602 is arranged within the second in-plane magnetic field component of the stray field to detect the second vector. While both the magnetoresistive sensor 302 and the magnetoresistive sensor 602 may also react to the external in-plane magnetic field, the resistive changes caused at the magnetoresistive sensor 302 and the magnetoresistive sensor 602 by the external in-plane magnetic field are canceled out by the sensor circuitry 610. Meanwhile, the resistive changes caused at the magnetoresistive sensor 302 and the magnetoresistive sensor 602 by the two antiparallel vectors of the stray field are summed together to provide a delta resistance value that is proportional to and representative only of the external out-of-plane magnetic field.

To summarize, the magnetoresistive sensor 302 may have a first electrical resistance that varies based on changes in the first magnetic free layer. The first electrical resistance may have a first resistance component corresponding to the first in-plane magnetic field component of the stray field and a second resistance component corresponding to the external in-plane magnetic field. The magnetoresistive sensor 602 may have a second electrical resistance that varies based on changes in the second magnetic free layer. The second electrical resistance may have a third resistance component corresponding to the second in-plane magnetic field component of the stray field and a fourth resistance component corresponding to the external in-plane magnetic field. The sensor circuitry 610 may be configured to measure the first electrical resistance and the second electrical resistance such that the second resistance component and the fourth resistance component are negated. Thus, the sensor circuitry 610 may generate a sensor signal representative of a combined resistance of the first resistance component and the third resistance component, where the combined resistance is proportional to the out-of-plane magnetic field.

As indicated above, FIG. 6 is provided as an example. Other examples may differ from what is described with regard to FIG. 6. The number and arrangement of components shown in FIG. 6 are provided as an example. In practice, the magnetic sensor system 600 may include additional components, fewer components, different components, or differently arranged components than those shown in FIG. 6. Two or more components shown in FIG. 6 may be implemented within a single component, or a single component shown in FIG. 6 may be implemented as multiple, distributed components. Additionally, or alternatively, a set of components (e.g., one or more components) of the magnetic sensor system 600 may perform one or more functions described as being performed by another set of components of the magnetic sensor system 600.

The following provides an overview of some Aspects of the present disclosure:

Aspect 1: A magnetic sensor system, comprising: a magnetoresistive sensor comprising a magnetic free layer having a sensing plane and a magnetically-free magnetization arranged within the sensing plane, wherein the magnetically-free magnetization is variable in a presence of an in-plane magnetic field that is aligned with the sensing plane; and a ferromagnetic disc having a magnetic vortex in a ground state, wherein the magnetic vortex is configured to react to an out-of-plane magnetic field and generate a stray field in response to the out-of-plane magnetic field being applied to the ferromagnetic disc, wherein the stray field has an in-plane magnetic field component that is proportional to the out-of-plane magnetic field, wherein the magnetic free layer is configured to receive the in-plane magnetic field component of the stray field, and wherein the magnetically-free magnetization is configured to change based on the in-plane magnetic field component of the stray field.

Aspect 2: The magnetic sensor system of Aspect 1, wherein the ferromagnetic disc is configured to convert the out-of-plane magnetic field into the stray field having the in-plane magnetic field component.

Aspect 3: The magnetic sensor system of any of Aspects 1-2, wherein the magnetic vortex provides a linear response to the out-of-plane magnetic field such that the in-plane magnetic field component of the stray field has a linear relationship with the out-of-plane magnetic field.

Aspect 4: The magnetic sensor system of any of Aspects 1-3, wherein the ferromagnetic disc generates the in-plane magnetic field component of the stray field from the out-of-plane magnetic field based on a linear response function, and wherein the in-plane magnetic field component of the stray field has a linear relationship with the out-of-plane magnetic field based on the linear response function.

Aspect 5: The magnetic sensor system of Aspect 4, wherein an aspect ratio between a thickness and a diameter of the ferromagnetic disc defines a linear range portion of the stray field, wherein the linear range portion of the stray field responds to the out-of-plane magnetic field in a linear manner based on the linear response function, and wherein the magnetic free layer responds in a linear manner to the linear range portion of the stray field.

Aspect 6: The magnetic sensor system of any of Aspects 1-5, wherein the ferromagnetic disc is configured to redirect the out-of-plane magnetic field, as the stray field, into the sensing plane of the magnetic free layer such that the in-plane magnetic field component of the stray field is aligned, in-plane, with the sensing plane of the magnetic free layer.

Aspect 7: The magnetic sensor system of any of Aspects 1-6, wherein the magnetoresistive sensor is a linear magnetoresistive sensor having a linear sensor response.

Aspect 8: The magnetic sensor system of any of Aspects 1-7, wherein the out-of-plane magnetic field is orthogonal to the in-plane magnetic field component.

Aspect 9: The magnetic sensor system of any of Aspects 1-8, wherein the magnetoresistive sensor is spatially separated from the ferromagnetic disc.

Aspect 10: The magnetic sensor system of any of Aspects 1-9, wherein a magnetization of the ferromagnetic disc is a closed-flux magnetization that is in a vortex state.

Aspect 11: The magnetic sensor system of any of Aspects 1-10, wherein the magnetoresistive sensor has an electrical conductance or an electrical resistance, and wherein the magnetoresistive sensor is configured to exhibit a linear change in the electrical conductance or the electrical resistance, that is proportional to the out-of-plane magnetic field, based on a change of the magnetically-free magnetization that is responsive to the in-plane magnetic field component of the stray field.

Aspect 12: The magnetic sensor system of any of Aspects 1-11, wherein the magnetic vortex is generated within the ferromagnetic disc based on a volume of the ferromagnetic disc, and wherein a linear stray field response of the magnetic vortex is defined by an aspect ratio of the ferromagnetic disc.

Aspect 13: The magnetic sensor system of any of Aspects 1-12, wherein the ferromagnetic disc is configured not to generate a measurable stray field at the magnetoresistive sensor when no external magnetic field or an insubstantial external magnetic field is applied to the ferromagnetic disc.

Aspect 14: The magnetic sensor system of any of Aspects 1-13, wherein the ferromagnetic disc is made of a soft ferromagnetic material.

Aspect 15: A magnetic sensor system, comprising: a first magnetoresistive sensor having a first sensitivity axis and a first magnetic free layer having a first magnetically-free magnetization that is variable in a presence of an in-plane magnetic field that is aligned with the first sensitivity axis; a second magnetoresistive sensor having a second sensitivity axis and a second magnetic free layer having a second magnetically-free magnetization that is variable in a presence of the in-plane magnetic field that is aligned with the second sensitivity axis; and a ferromagnetic disc having a magnetic vortex in a ground state, wherein the magnetic vortex is configured to react to an out-of-plane magnetic field and generate a stray field in response to the out-of-plane magnetic field being applied to the ferromagnetic disc, wherein the stray field decays with an increasing distance from the ferromagnetic disc, wherein the first magnetoresistive sensor is arranged within the stray field and the second magnetoresistive sensor is arranged outside of the stray field, wherein the stray field has an in-plane magnetic field component that is proportional to the out-of-plane magnetic field, wherein the first magnetic free layer is configured to receive the in-plane magnetic field component of the stray field, and wherein the first magnetically-free magnetization is configured to change based on the in-plane magnetic field component of the stray field.

Aspect 16: The magnetic sensor system of Aspect 15, wherein the first magnetoresistive sensor has a first electrical resistance that varies based on changes in the first magnetic free layer, wherein the second magnetoresistive sensor has a second electrical resistance that varies based on changes in the second magnetic free layer, wherein the first magnetic free layer is configured to change based on the stray field and the in-plane magnetic field such that the first electrical resistance has a first resistance component corresponding to the in-plane magnetic field component of the stray field and a second resistance component corresponding to the in-plane magnetic field, wherein the second magnetic free layer is configured to change based on the in-plane magnetic field such that a total resistance of the second electrical resistance corresponds to the in-plane magnetic field, wherein the magnetic sensor system further comprises a sensor circuit configured to measure the first electrical resistance and the second electrical resistance such that the second resistance component is negated by the second electrical resistance, and wherein the sensor circuit is configured to generate a sensor signal representative of the first resistance component corresponding to the in-plane magnetic field component of the stray field.

Aspect 17: The magnetic sensor system of any of Aspects 15-16, wherein the first magnetoresistive sensor and the second magnetoresistive sensor are arranged at a same lateral side of the ferromagnetic disc.

Aspect 18: A magnetic sensor system, comprising: a ferromagnetic disc having a magnetic vortex in a ground state, wherein the magnetic vortex is configured to react to an out-of-plane magnetic field and generate a stray field in response to the out-of-plane magnetic field being applied to the ferromagnetic disc, wherein the stray field has a first in-plane magnetic field component and a second in-plane magnetic field component that are proportional to the out-of-plane magnetic field, and wherein the first in-plane magnetic field component has a first vector in a first direction and the second in-plane magnetic field component has a second vector in a second direction that is antiparallel to the first direction; a first magnetoresistive sensor having a first sensitivity axis and a first magnetic free layer having a first magnetically-free magnetization that is variable in a presence of an external in-plane magnetic field that is aligned with the first sensitivity axis; and a second magnetoresistive sensor having a second sensitivity axis and a second magnetic free layer having a second magnetically-free magnetization that is variable in a presence of the external in-plane magnetic field that is aligned with the second sensitivity axis, wherein the first sensitivity axis is parallel to the second sensitivity axis, wherein the first magnetoresistive sensor is arranged within the first in-plane magnetic field component of the stray field to detect the first vector, and wherein the second magnetoresistive sensor is arranged within the second in-plane magnetic field component of the stray field to detect the second vector.

Aspect 19: The magnetic sensor system of Aspect 18, wherein the first magnetoresistive sensor and the second magnetoresistive sensor are located at opposite lateral sides of the ferromagnetic disc.

Aspect 20: The magnetic sensor system of any of Aspects 18-19, wherein the external in-plane magnetic field is a homogeneous magnetic field that extends through both the first magnetoresistive sensor and the second magnetoresistive sensor in either the first direction or the second direction, wherein the first magnetically-free magnetization is configured to change based on the first in-plane magnetic field component of the stray field and the external in-plane magnetic field, and wherein the second magnetically-free magnetization is configured to change based on the second in-plane magnetic field component of the stray field and the external in-plane magnetic field.

Aspect 21: The magnetic sensor system of any of Aspects 18-20, wherein the first magnetoresistive sensor has a first electrical resistance that varies based on changes in the first magnetic free layer, wherein the first electrical resistance has a first resistance component corresponding to the first in-plane magnetic field component of the stray field and a second resistance component corresponding to the external in-plane magnetic field, wherein the second magnetoresistive sensor has a second electrical resistance that varies based on changes in the second magnetic free layer, wherein the second electrical resistance has a third resistance component corresponding to the second in-plane magnetic field component of the stray field and a fourth resistance component corresponding to the external in-plane magnetic field, wherein the magnetic sensor system further comprises a sensor circuit configured to measure the first electrical resistance and the second electrical resistance such that the second resistance component and the fourth resistance component are negated, wherein the sensor circuit is configured to generate a sensor signal representative of a combined resistance of the first resistance component and the third resistance component, and wherein the combined resistance is proportional to the out-of-plane magnetic field.

Aspect 22: A system configured to perform one or more operations recited in one or more of Aspects 1-21.

Aspect 23: An apparatus comprising means for performing one or more operations recited in one or more of Aspects 1-21.

Aspect 24: A non-transitory computer-readable medium storing a set of instructions, the set of instructions comprising one or more instructions that, when executed by a device, cause the device to perform one or more operations recited in one or more of Aspects 1-21.

Aspect 25: A computer program product comprising instructions or code for executing one or more operations recited in one or more of Aspects 1-21.

The foregoing disclosure provides illustration and description, but is not intended to be exhaustive or to limit the implementations to the precise form disclosed. Modifications and variations may be made in light of the above disclosure or may be acquired from practice of the implementations.

Some implementations may be described herein in connection with thresholds. As used herein, "satisfying" a threshold may refer to a value being greater than the threshold, more than the threshold, higher than the threshold, greater than or equal to the threshold, less than the threshold, fewer than the threshold, lower than the threshold, less than or equal to the threshold, equal to the threshold, or the like.

As used herein, the term "component" is intended to be broadly construed as hardware, firmware, or a combination of hardware and software. Systems and/or methods described herein may be implemented in different forms of hardware, firmware, or a combination of hardware and software. The actual specialized control hardware or software code used to implement these systems and/or methods is not limiting of the implementations. Thus, the operation and behavior of the systems and/or methods are described herein without reference to specific software code—it being understood that software and hardware can be designed to implement the systems and/or methods based on the description herein.

Any of the processing components may be implemented as a central processing unit (CPU) or other processor reading and executing a software program from a non-transitory computer-readable recording medium such as a hard disk or a semiconductor memory device. For example, instructions may be executed by one or more processors, such as one or more CPUs, digital signal processors (DSPs), general-purpose microprocessors, application-specific integrated circuits (ASICs), field programmable logic arrays (FPLAs), programmable logic controller (PLC), or other equivalent integrated or discrete logic circuitry. Accordingly, the term "processor," as used herein, refers to any of the foregoing structures or any other structure suitable for implementation of the techniques described herein. Software may be stored on a non-transitory computer-readable medium such that the non-transitory computer readable medium includes program code or a program algorithm stored thereon that, when executed, causes the processor, via a computer program, to perform the steps of a method.

A controller including hardware may also perform one or more of the techniques of this disclosure. A controller, including one or more processors, may use electrical signals and digital algorithms to perform its receptive, analytic, and control functions, which may further include corrective functions. Such hardware, software, and firmware may be implemented within the same device or within separate devices to support the various techniques described in this disclosure.

A signal processing circuit and/or a signal conditioning circuit may receive one or more signals (e.g., measurement signals) from one or more components in the form of raw measurement data and may derive, from the measurement signal, further information. "Signal conditioning," as used herein, refers to manipulating an analog signal in such a way that the signal meets the requirements of a next stage for further processing. Signal conditioning may include converting from analog to digital (e.g., via an analog-to-digital converter), amplification, filtering, converting, biasing, range matching, isolation, and any other processes required to make a signal suitable for processing after conditioning.

Even though particular combinations of features are recited in the claims and/or disclosed in the specification, these combinations are not intended to limit the disclosure of implementations described herein. Many of these features may be combined in ways not specifically recited in the claims and/or disclosed in the specification. For example, the disclosure includes each dependent claim in a claim set in combination with every other individual claim in that claim set and every combination of multiple claims in that claim set. As used herein, a phrase referring to "at least one of" a list of items refers to any combination of those items, including single members. As an example, "at least one of: a, b, or c" is intended to cover a, b, c, a and b, a and c, b and c, and a, b, and c, as well as any combination with multiples of the same element (e.g., a+a, a+a+a, a+a+b, a+a+c, a+b+b, a+c+c, b+b, b+b+b, b+b+c, c+c, and c+c+c, or any other ordering of a, b, and c).

Further, it is to be understood that the disclosure of multiple acts or functions disclosed in the specification or in the claims may not be construed as to be within the specific order. Therefore, the disclosure of multiple acts or functions will not limit these to a particular order unless such acts or functions are not interchangeable for technical reasons. Furthermore, in some implementations, a single act may include or may be broken into multiple sub acts. Such sub acts may be included and part of the disclosure of this single act unless explicitly excluded.

No element, act, or instruction used herein should be construed as critical or essential unless explicitly described as such. Also, as used herein, the articles "a" and "an" are intended to include one or more items and may be used interchangeably with "one or more." Further, as used herein, the article "the" is intended to include one or more items referenced in connection with the article "the" and may be used interchangeably with "the one or more." Where only one item is intended, the phrase "only one," "single," or similar language is used. Also, as used herein, the terms "has," "have," "having," or the like are intended to be open-ended terms that do not limit an element that they modify (e.g., an element "having" A may also have B).

Further, the phrase "based on" is intended to mean "based, at least in part, on" unless explicitly stated otherwise. As used herein, the term "multiple" can be replaced with "a plurality of" and vice versa. Also, as used herein, the term "or" is intended to be inclusive when used in a series and may be used interchangeably with "and/or," unless explicitly stated otherwise (e.g., if used in combination with "either" or "only one of").

What is claimed is:

1. A magnetic sensor system, comprising:
a magnetoresistive sensor comprising a magnetic free layer having a sensing plane and a magnetically-free magnetization arranged within the sensing plane, wherein the magnetically-free magnetization is variable in a presence of an in-plane magnetic field that is aligned with the sensing plane; and
a ferromagnetic disc having a magnetic vortex in a ground state, wherein the magnetic vortex is configured to react to an out-of-plane magnetic field and generate a stray field in response to the out-of-plane magnetic field being applied to the ferromagnetic disc,
wherein the stray field has an in-plane magnetic field component that is proportional to the out-of-plane magnetic field,
wherein the magnetic free layer is configured to receive the in-plane magnetic field component of the stray field, and
wherein the magnetically-free magnetization is configured to change based on the in-plane magnetic field component of the stray field.

2. The magnetic sensor system of claim 1, wherein the ferromagnetic disc is configured to convert the out-of-plane magnetic field into the stray field having the in-plane magnetic field component.

3. The magnetic sensor system of claim 1, wherein the magnetic vortex provides a linear response to the out-of-plane magnetic field such that the in-plane magnetic field component of the stray field has a linear relationship with the out-of-plane magnetic field.

4. The magnetic sensor system of claim 1, wherein the ferromagnetic disc generates the in-plane magnetic field component of the stray field from the out-of-plane magnetic field based on a linear response function, and
wherein the in-plane magnetic field component of the stray field has a linear relationship with the out-of-plane magnetic field based on the linear response function.

5. The magnetic sensor system of claim 4, wherein an aspect ratio between a thickness and a diameter of the ferromagnetic disc defines a linear range portion of the stray field,
wherein the linear range portion of the stray field responds to the out-of-plane magnetic field in a linear manner based on the linear response function, and
wherein the magnetic free layer responds in a linear manner to the linear range portion of the stray field.

6. The magnetic sensor system of claim 1, wherein the ferromagnetic disc is configured to redirect the out-of-plane magnetic field, as the stray field, into the sensing plane of the magnetic free layer such that the in-plane magnetic field component of the stray field is aligned, in-plane, with the sensing plane of the magnetic free layer.

7. The magnetic sensor system of claim 1, wherein the magnetoresistive sensor is a linear magnetoresistive sensor having a linear sensor response.

8. The magnetic sensor system of claim 1, wherein the out-of-plane magnetic field is orthogonal to the in-plane magnetic field component.

9. The magnetic sensor system of claim 1, wherein the magnetoresistive sensor is spatially separated from the ferromagnetic disc.

10. The magnetic sensor system of claim 1, wherein a magnetization of the ferromagnetic disc is a closed-flux magnetization that is in a vortex state.

11. The magnetic sensor system of claim 1, wherein the magnetoresistive sensor has an electrical conductance or an electrical resistance, and
wherein the magnetoresistive sensor is configured to exhibit a linear change in the electrical conductance or the electrical resistance, that is proportional to the out-of-plane magnetic field, based on a change of the magnetically-free magnetization that is responsive to the in-plane magnetic field component of the stray field.

12. The magnetic sensor system of claim 1, wherein the magnetic vortex is generated within the ferromagnetic disc based on a volume of the ferromagnetic disc, and
wherein a linear stray field response of the magnetic vortex is defined by an aspect ratio of the ferromagnetic disc.

13. The magnetic sensor system of claim 1, wherein the ferromagnetic disc is configured not to generate a measurable stray field at the magnetoresistive sensor when no external magnetic field or an insubstantial external magnetic field is applied to the ferromagnetic disc.

14. The magnetic sensor system of claim 1, wherein the ferromagnetic disc is made of a soft ferromagnetic material.

15. A magnetic sensor system, comprising:
a first magnetoresistive sensor having a first sensitivity axis and a first magnetic free layer having a first magnetically-free magnetization that is variable in a presence of an in-plane magnetic field that is aligned with the first sensitivity axis;
a second magnetoresistive sensor having a second sensitivity axis and a second magnetic free layer having a second magnetically-free magnetization that is variable in a presence of the in-plane magnetic field that is aligned with the second sensitivity axis; and
a ferromagnetic disc having a magnetic vortex in a ground state, wherein the magnetic vortex is configured to react to an out-of-plane magnetic field and generate a stray field in response to the out-of-plane magnetic field being applied to the ferromagnetic disc, wherein the stray field decays with an increasing distance from the ferromagnetic disc,
wherein the first magnetoresistive sensor is arranged within the stray field and the second magnetoresistive sensor is arranged outside of the stray field,
wherein the stray field has an in-plane magnetic field component that is proportional to the out-of-plane magnetic field,
wherein the first magnetic free layer is configured to receive the in-plane magnetic field component of the stray field, and
wherein the first magnetically-free magnetization is configured to change based on the in-plane magnetic field component of the stray field.

16. The magnetic sensor system of claim 15, wherein the first magnetoresistive sensor has a first electrical resistance that varies based on changes in the first magnetic free layer, wherein the second magnetoresistive sensor has a second electrical resistance that varies based on changes in the second magnetic free layer,
wherein the first magnetic free layer is configured to change based on the stray field and the in-plane magnetic field such that the first electrical resistance has a first resistance component corresponding to the in-plane magnetic field component of the stray field and a second resistance component corresponding to the in-plane magnetic field,
wherein the second magnetic free layer is configured to change based on the in-plane magnetic field such that a total resistance of the second electrical resistance corresponds to the in-plane magnetic field,
wherein the magnetic sensor system further comprises a sensor circuit configured to measure the first electrical resistance and the second electrical resistance such that the second resistance component is negated by the second electrical resistance, and
wherein the sensor circuit is configured to generate a sensor signal representative of the first resistance component corresponding to the in-plane magnetic field component of the stray field.

17. The magnetic sensor system of claim 15, wherein the first magnetoresistive sensor and the second magnetoresistive sensor are arranged at a same lateral side of the ferromagnetic disc.

18. A magnetic sensor system, comprising:
a ferromagnetic disc having a magnetic vortex in a ground state, wherein the magnetic vortex is configured to react to an out-of-plane magnetic field and generate a stray field in response to the out-of-plane magnetic field being applied to the ferromagnetic disc, wherein the stray field has a first in-plane magnetic field component and a second in-plane magnetic field component that are proportional to the out-of-plane magnetic field, and wherein the first in-plane magnetic field component has a first vector in a first direction and the second in-plane magnetic field component has a second vector in a second direction that is antiparallel to the first direction;
a first magnetoresistive sensor having a first sensitivity axis and a first magnetic free layer having a first magnetically-free magnetization that is variable in a presence of an external in-plane magnetic field that is aligned with the first sensitivity axis; and
a second magnetoresistive sensor having a second sensitivity axis and a second magnetic free layer having a second magnetically-free magnetization that is variable in a presence of the external in-plane magnetic field that is aligned with the second sensitivity axis,
wherein the first sensitivity axis is parallel to the second sensitivity axis,
wherein the first magnetoresistive sensor is arranged within the first in-plane magnetic field component of the stray field to detect the first vector, and
wherein the second magnetoresistive sensor is arranged within the second in-plane magnetic field component of the stray field to detect the second vector.

19. The magnetic sensor system of claim 18, wherein the first magnetoresistive sensor and the second magnetoresistive sensor are located at opposite lateral sides of the ferromagnetic disc.

20. The magnetic sensor system of claim 18, wherein the external in-plane magnetic field is a homogeneous magnetic field that extends through both the first magnetoresistive sensor and the second magnetoresistive sensor in either the first direction or the second direction, wherein the first magnetically-free magnetization is configured to change based on the first in-plane magnetic field component of the stray field and the external in-plane magnetic field, and wherein the second magnetically-free magnetization is configured to change based on the second in-plane magnetic field component of the stray field and the external in-plane magnetic field.

21. The magnetic sensor system of claim 18, wherein the first magnetoresistive sensor has a first electrical resistance that varies based on changes in the first magnetic free layer, wherein the first electrical resistance has a first resistance component corresponding to the first in-plane magnetic field component of the stray field and a second resistance component corresponding to the external in-plane magnetic field, wherein the second magnetoresistive sensor has a second electrical resistance that varies based on changes in the second magnetic free layer, wherein the second electrical resistance has a third resistance component corresponding to the second in-plane magnetic field component of the stray field and a fourth resistance component corresponding to the external in-plane magnetic field, wherein the magnetic sensor system further comprises a sensor circuit configured to measure the first electrical resistance and the second electrical resistance such that the second resistance component and the fourth resistance component are negated, wherein the sensor circuit is configured to generate a sensor signal representative of a combined resistance of the first resistance component and the third resistance component, and wherein the combined resistance is proportional to the out-of-plane magnetic field.

* * * * *